United States Patent
Arbore et al.

(10) Patent No.: US 12,206,032 B2
(45) Date of Patent: Jan. 21, 2025

(54) WIDEBAND BACK-ILLUMINATED ELECTROMAGNETIC RADIATION DETECTORS

(71) Applicant: Apple Inc., Cupertino, CA (US)

(72) Inventors: Mark Alan Arbore, Los Altos, CA (US); Matthew T. Morea, Cupertino, CA (US); Miikka M. Kangas, Campbell, CA (US); Romain F. Chevallier, Sunnyvale, CA (US); Tomas Sarmiento, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 643 days.

(21) Appl. No.: 17/385,813

(22) Filed: Jul. 26, 2021

(65) Prior Publication Data

US 2022/0037543 A1 Feb. 3, 2022

Related U.S. Application Data

(60) Provisional application No. 63/059,862, filed on Jul. 31, 2020.

(51) Int. Cl.
*H01L 31/0304* (2006.01)
*H01L 27/144* (2006.01)
(Continued)

(52) U.S. Cl.
CPC .... *H01L 31/03046* (2013.01); *H01L 27/1446* (2013.01); *H01L 31/0203* (2013.01); *H01L 31/02327* (2013.01)

(58) Field of Classification Search
CPC ........... H01L 31/03046; H01L 31/0203; H01L 31/02327; H01L 31/02325;
(Continued)

(56) References Cited

U.S. PATENT DOCUMENTS 4,042,821 A 8/1977 Mierzwinski
5,479,032 A * 12/1995 Forrest ................ H01L 31/0352
257/190
(Continued)

FOREIGN PATENT DOCUMENTS

AU 2018269000 1/2020
JP H09270527 10/1997
(Continued)

OTHER PUBLICATIONS

U.S. Appl. No. 17/412,097, filed Aug. 25, 2021, Hong et al.
(Continued)

*Primary Examiner* — Sitaramarao S Yechuri
(74) *Attorney, Agent, or Firm* — Brownstein Hyatt Farber Schreck, LLP

(57) ABSTRACT

An electromagnetic radiation detector includes an InP substrate having a first surface opposite a second surface; a first InGaAs electromagnetic radiation absorber stacked on the first surface and configured to absorb a first set of electromagnetic radiation wavelengths; a set of one or more buffer layers stacked on the first InGaAs electromagnetic radiation absorber and configured to absorb at least some of the first set of electromagnetic radiation wavelengths; a second InGaAs electromagnetic radiation absorber stacked on the set of one or more buffer layers and configured to absorb a second set of electromagnetic radiation wavelengths; and an immersion condenser lens formed on the second surface and configured to direct electromagnetic radiation through the InP substrate and toward the first InGaAs electromagnetic radiation absorber and the second InGaAs electromagnetic radiation absorber.

21 Claims, 17 Drawing Sheets

(51) Int. Cl.
*H01L 31/0203* (2014.01)
*H01L 31/0232* (2014.01)

(58) Field of Classification Search
CPC ......... H01L 31/035272; H01L 31/1013; H01L 27/1446; H01L 27/14601; H01L 27/14618; H01L 27/14625; H01L 27/14694; G01J 2001/0257; G01J 1/0271; G01J 1/0411; G01J 1/4228; G01J 1/0209; G01J 3/0208; G01J 3/0259; G01J 3/42

See application file for complete search history.

(56) References Cited

U.S. PATENT DOCUMENTS

| | | | |
|---|---|---|---|
| 7,135,698 | B2 | 11/2006 | Mitra |
| 7,244,924 | B2 | 7/2007 | Kiyomoto et al. |
| 8,816,415 | B2 | 8/2014 | Liu et al. |
| 8,816,461 | B2 | 8/2014 | Yuan et al. |
| 9,000,372 | B2 | 4/2015 | Tsuchiya |
| 9,817,199 | B2 | 11/2017 | Sherrer |
| 9,825,073 | B2 | 11/2017 | Webster |
| 9,923,114 | B2 | 3/2018 | de Lyon et al. |
| 9,929,200 | B2 | 3/2018 | Sato |
| 10,344,328 | B2 | 7/2019 | Barbee et al. |
| 10,374,072 | B2 | 8/2019 | Nuzzo et al. |
| 10,375,282 | B2 | 8/2019 | Ishida et al. |
| 10,462,402 | B2 | 10/2019 | Fan |
| 10,644,187 | B2 | 5/2020 | Chen et al. |
| 10,687,718 | B2 | 6/2020 | Allec et al. |
| 10,808,150 | B2 | 10/2020 | Kato et al. |
| 10,963,104 | B2 | 3/2021 | Bergström et al. |
| 11,158,757 | B2 | 10/2021 | Li et al. |
| 2010/0051905 | A1* | 3/2010 | Iguchi ............... H01L 31/03042 257/E29.069 |
| 2013/0260565 | A1* | 10/2013 | Nishimoto ........ H01L 31/02327 438/703 |
| 2014/0339580 | A1* | 11/2014 | Park ....................... H01L 33/08 257/90 |
| 2017/0155010 | A1* | 6/2017 | de Lyon ............ H01L 31/03046 |
| 2017/0325698 | A1* | 11/2017 | Allec ..................... A61B 5/721 |
| 2019/0319055 | A1 | 10/2019 | Zaizen et al. |
| 2020/0168757 | A1* | 5/2020 | Lin ....................... H01L 31/167 |
| 2022/0320168 | A1 | 10/2022 | Mahgerefteh et al. |
| 2022/0397651 | A1 | 12/2022 | Murase et al. |

FOREIGN PATENT DOCUMENTS

| | | |
|---|---|---|
| WO | WO 18/088083 | 5/2018 |
| WO | WO 18/187370 | 10/2018 |
| WO | WO 20/072458 | 4/2020 |

OTHER PUBLICATIONS

U.S. Appl. No. 17/464,550, filed Sep. 1, 2021, Mahgerefteh et al.

Invitation to Pay Additional Fees dated Nov. 15, 2021, PCT/US2021/043596, 9 pages.

Jakšić et al., "Plasmonic Enhancement of Light Trapping in Photodetectors," *Facta Universitatis*, Series: Electronics and Energetics, vol. 27, No. 2, Jun. 2014, pp. 183-203.

Ma et al., Plasmonically Enhanced Graphene Photodetector Featuring 100 Dbit/s Data Reception, High Responsivity, and Compact Size, *ACS Photonics*, 2019, vol. 6, pp. 154-161.

Piotrowski, "Recent progress in uncooled photodetection of the mid-infrared radiation," Communications and Photonics Conference (ACP), 2012, Asia, IEEE, Nov. 7, 2012, pp. 1-6.

Zhou et al., "Direct nearfield optical imaging of UV bowtie nanoantennas," *Optics Express*, vol. 17, Issue 22, 2009, pp. 20301-20306 or 11 pages.

Sun et al., "Performance of dual-band short- or mid-wavelength infrared photodetectors based on InGaAsSb bulk materials and InAs/GaSb superlattices," Chin. Phys. B., vol. 26, No. 9, 2017, pp. 098506-1-098506-4.

\* cited by examiner

WIDEBAND BACK-ILLUMINATED ELECTROMAGNETIC RADIATION DETECTORS

CROSS-REFERENCE TO RELATED APPLICATION

This application is a nonprovisional of, and claims the benefit under 35 U.S.C. § 119(e) of, U.S. Provisional Patent Application No. 63/059,862, filed Jul. 31, 2020, the contents of which are incorporated herein by reference as if fully disclosed herein.

FIELD

The described embodiments relate to the detection of electromagnetic radiation and, more particularly, to the detection of electromagnetic radiation over a wide band.

BACKGROUND

Sensors are included in many of today's electronic devices, including electronic devices such as smartphones, computers (e.g., tablet computers or laptop computers), wearable electronic devices (e.g., electronic watches, smart watches, or health monitors), game controllers, navigation systems (e.g., vehicle navigation systems or robot navigation systems), and so on. Sensors may variously sense the presence of objects, distances to objects, proximities of objects, movements of objects (e.g., whether objects are moving, or the speed, acceleration, or direction of movement of objects), compositions of objects, and so on.

One useful type of sensor is the electromagnetic radiation detector (or equivalently, an electromagnetic radiation sensor, an optical sensor, or an optical detector). Some electromagnetic radiation detectors may be configured to sense a wide band of electromagnetic radiation wavelengths, while others may be configured to sense a narrow band or multiple different bands of electromagnetic radiation wavelengths. At times, a new type of electromagnetic radiation detector needs to be developed to sense a particular band or bands of electromagnetic radiation wavelengths, or to sense a particular band or bands of electromagnetic radiation effectively (e.g., with a high enough signal-to-noise ratio (SNR)).

SUMMARY

Embodiments of the systems, devices, methods, and apparatus described in the present disclosure are directed to wideband back-illuminated electromagnetic radiation detectors. In some embodiments, wideband electromagnetic radiation detectors are described. For purposes of this description, a wideband electromagnetic radiation detector is a detector that is capable of detecting electromagnetic radiation wavelengths within a spectral wavelength range of 0.5 micrometers ($\mu m$) or greater. In some embodiments, short-wave infrared (SWIR) electromagnetic radiation detectors are described. For purposes of this description, SWIR electromagnetic radiation is considered to be electromagnetic radiation within a range of about 0.7 $\mu m$ to about 3.0 $\mu m$. Despite many of the disclosed examples pertaining to wideband and/or SWIR electromagnetic radiation detectors, the systems, devices, methods, and apparatus described herein can be configured to detect various ranges of electromagnetic radiation wavelengths, including wavelengths within a narrow band and/or wavelengths outside of SWIR electromagnetic radiation.

In a first aspect, the present disclosure describes an electromagnetic radiation detector. The electromagnetic radiation detector may include an indium phosphide (InP) substrate having a first surface opposite a second surface; a first indium gallium arsenide (InGaAs) electromagnetic radiation absorber stacked on the first surface and configured to absorb a first set of electromagnetic radiation wavelengths; a set of one or more buffer layers stacked on the first InGaAs electromagnetic radiation absorber and configured to absorb at least some of the first set of electromagnetic radiation wavelengths; a second InGaAs electromagnetic radiation absorber stacked on the set of one or more buffer layers and configured to absorb a second set of electromagnetic radiation wavelengths; and an immersion condenser lens formed on the second surface and configured to direct electromagnetic radiation through the InP substrate and toward the first InGaAs electromagnetic radiation absorber and the second InGaAs electromagnetic radiation absorber. The second set of electromagnetic radiation wavelengths may include at least some electromagnetic radiation wavelengths that are not in the first set of electromagnetic radiation wavelengths.

In a second aspect, the present disclosure describes an electromagnetic radiation detection system. The system may include a substrate, a first electromagnetic radiation emitter, a second electromagnetic radiation emitter, and a detection circuit. On a first surface of the substrate, there may be a first electromagnetic radiation absorber, a second electromagnetic radiation absorber, and a buffer positioned between the first and second electromagnetic radiation absorbers. The detection circuit may be configured to operate the first and second electromagnetic radiation emitters, and to separately detect: first electromagnetic radiation emitted by the first electromagnetic radiation emitter by reading a first current generated by the first electromagnetic radiation absorber; and second electromagnetic radiation emitted by the second electromagnetic radiation emitter by reading a second current generated by the second electromagnetic radiation absorber.

In a third aspect, the present disclosure describes an electronic device. The electronic device may include a housing, an electromagnetic radiation emitter configured to emit electromagnetic radiation through the housing, and an electromagnetic radiation detector configured to receive electromagnetic radiation returned from a target. The electromagnetic radiation detector may also include a substrate having a first surface opposite a second surface; a first electromagnetic radiation absorber stacked on the first surface and configured to absorb a first set of electromagnetic radiation wavelengths; a buffer stacked on the first electromagnetic radiation absorber and configured to absorb at least some of the first set of electromagnetic radiation wavelengths; and a second electromagnetic radiation absorber stacked on the buffer and configured to absorb a second set of electromagnetic radiation wavelengths. The second set of electromagnetic radiation wavelengths may include at least some electromagnetic radiation wavelengths that are not in the first set of electromagnetic radiation wavelengths.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
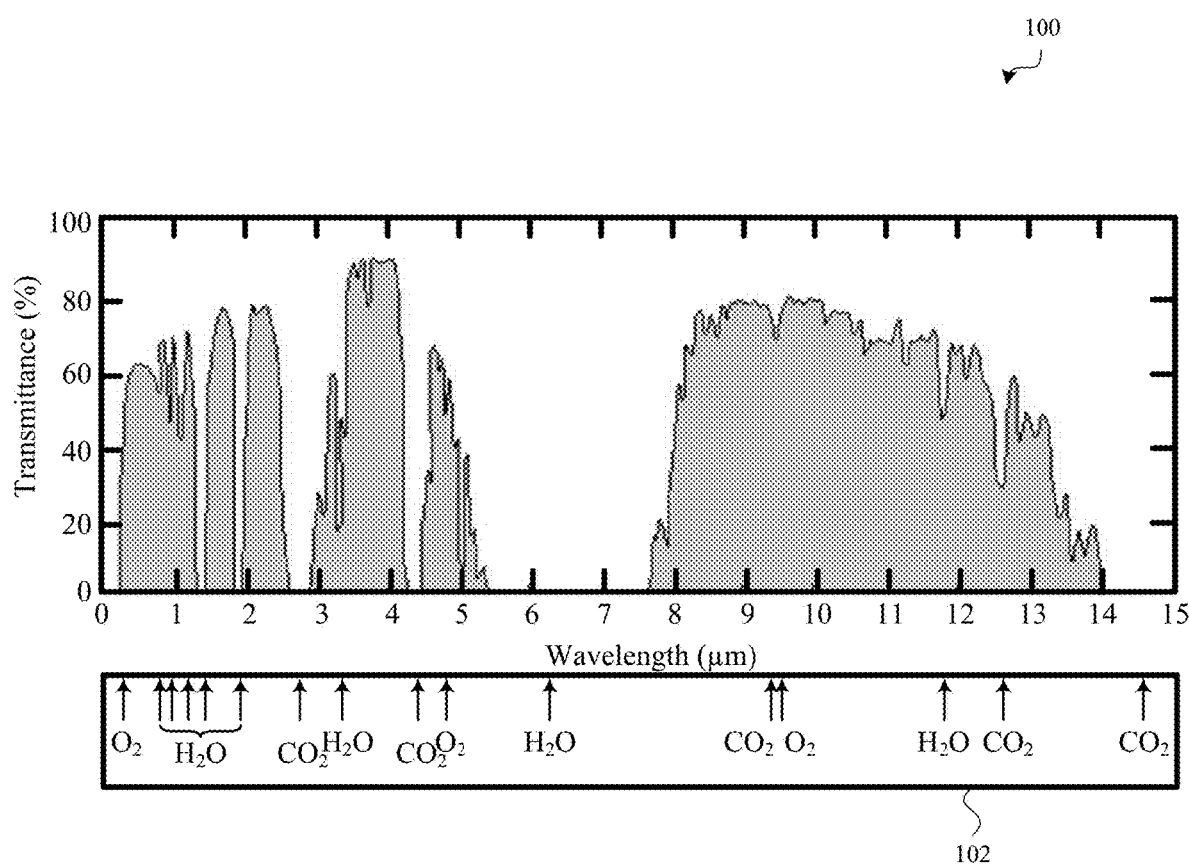
FIG. 1 is a graph that illustrates the transmittance of various wavelengths of electromagnetic radiation in the atmosphere.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof), and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Although the constructions and techniques described herein can be applied to electromagnetic radiation detectors that are tailored for the detection of various ranges of electromagnetic radiation wavelengths, the described techniques have particular applicability to, and are described primarily with reference to, wideband SWIR electromagnetic radiation detectors. Most of the electromagnetic radiation within this range of wavelengths is only minimally absorbed by atmospheric components such as water, oxygen, and carbon dioxide and, thus, this range is a good range for sensing other materials or components (e.g., particulate matter, skin, blood, and so on).

Some of the constructions and techniques described herein can also increase SNR. For example, some constructions and techniques can increase SNR by reducing dark current.

One type of electromagnetic radiation detector is the InGaAs detector. Some InGaAs detectors include a layer of InGaAs (an electromagnetic radiation absorber) that is epitaxially grown on a substrate (e.g., an InP substrate) in a lattice-matched configuration. Although such an electromagnetic radiation detector has low dark current and high SNR, its useful absorption range (or detection range) can be limited.

To extend the absorption range of an InGaAs detector to longer electromagnetic radiation wavelengths, a set of one or more buffer layers can be grown on a substrate, and an InGaAs layer (an electromagnetic radiation absorber) can be grown on the set of one or more buffer layers in a non-lattice-matched configuration. Such an InGaAs detector can be configured to receive electromagnetic radiation through its front side (i.e., in a front side illuminated (FSI) or front-illuminated configuration) or through its back side (i.e., in a back side illuminated (BSI) or back-illuminated configuration). An FSI configuration can eliminate lost light due to substrate or buffer absorption, and is easy to fabricate. In a BSI configuration, the InGaAs detector receives electromagnetic radiation through the detector's substrate before the electromagnetic radiation impinges on the detector's InGaAs layer. These kinds of InGaAs detector may have an absorption range that includes longer wavelengths than an InGaAs detector having a lattice-matched InGaAs layer. However, the detector's absorption of shorter wavelengths is sacrificed in a BSI configuration, as these wavelengths tend to be absorbed by the buffer layer(s) before they reach the InGaAs layer. The detector's ability to detect shorter wavelengths may also be more significantly impacted by dark current.

To extend the bandwidth of an electromagnetic radiation detector while maintaining a good SNR across much or all of its absorption range, two InGaAs electromagnetic radiation absorbers may be stacked on an InP substrate instead of one. To "tune" the detector and extend its bandwidth, one or more buffer layers may be grown between the InGaAs electromagnetic radiation absorbers. Because the buffer layer(s) may have high absorption in the same wavelength range as the InGaAs electromagnetic radiation absorber that is closest to the InP substrate, the detector may be used in a BSI configuration. In this manner, wavelengths that might otherwise be absorbed by the buffer layer(s) are first absorbed by the InGaAs electromagnetic radiation absorber closest to the InP substrate. By absorbing wavelengths in the absorption range of the InGaAs electromagnetic radiation absorber that is closest to the InP substrate, the buffer layer(s) enable the farther InGaAs electromagnetic radiation absorber to primarily absorb a range of wavelengths that does not overlap the range of wavelengths absorbed by the closer InGaAs electromagnetic radiation absorber and buffer layer(s). In some embodiments of this type of electromagnetic radiation detector, a second set of one or more buffer layers may be grown between the InP substrate and the closest InGaAs electromagnetic radiation absorber, thereby adjusting the range of wavelengths absorbed by the closest InGaAs electromagnetic radiation absorber. The absorption cut-on and cut-off of each InGaAs electromagnetic radiation absorber may be adjusted by changing the number or thickness of the buffer layer(s), or adjusting the materials or doping of the buffer layer(s) and/or InGaAs electromagnetic radiation absorbers, or in other ways. Different cut-ons and cut-offs may provide advantages in different sensing applications (e.g., different sensing ranges, different levels of dark current and SNR, different responsivities or detectivities, and so on). An additional advantage that is enabled by a BSI-configured InGaAs detector having two InGaAs electromagnetic radiation absorbers is a simplified InGaAs electromagnetic radiation absorber construction, which is sometimes helpful for improving signal absorption. A BSI-configured InGaAs detector also has a higher electrical connection density, which can be useful for InGaAs detectors that are used in detector arrays.

In some embodiments, the detector described in the preceding paragraph may be used in an FSI configuration.

In some embodiments, an immersion condenser lens may be formed on the back side of a BSI-configured InGaAs detector (i.e., on the surface of the detector that does not carry the InGaAs electromagnetic radiation absorbers. This can enable more electromagnetic radiation to be received and condensed onto a detector having a smaller footprint (i.e., smaller surface area). An immersion condenser lens may in some cases provide an electromagnetic radiation collection efficiency with improvement equal to the square of the refractive index of the detector substrate (e.g., a collection efficiency increase of about 10× for a detector with an InP substrate).

In some cases, the detectors described herein may be used to simultaneously or sequentially detect different wavelengths of electromagnetic radiation emitted by the same or different electromagnetic radiation emitters.

These and other techniques are described with reference to FIGS. 1-16. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

As used herein, a "substrate" refers to a block or mass of common material. As used herein, a "layer" refers to one or more materials that are typically, but not necessarily, parallel to the top surface and/or bottom surface of a substrate or another layer. As used herein, a component, material, or layer that is "stacked" on another component, material, or layer may be formed directly on the other component, material, or layer, or may be attached to and separated from the other component, material, or layer by one or more other components, materials, or layers in a common "stack." The terms "on" and "directly on" are used interchangeably herein.

FIG. 1 is a graph 100 that illustrates the transmittance of various wavelengths of electromagnetic radiation in the atmosphere. Electromagnetic radiation wavelengths (in μm) are shown along the horizontal axis of the graph 100, and transmittance (in percent (%)) is shown along the vertical axis of the graph 100. A transmittance of less than 100% for a particular wavelength means the atmosphere absorbs at least some portion of the electromagnetic radiation having the particular wavelength.

Also shown in FIG. 1 is a block representation of the atmosphere 102, and some of the molecules in the atmosphere 102 that absorb electromagnetic radiation at particular wavelengths (in some cases, interfering with or inhibiting an intended sensing operation). The molecules shown in FIG. 1 include water ($H_2O$), oxygen ($O_2$), and carbon dioxide ($CO_2$).

In some cases, it may be useful to detect a wide range of SWIR wavelengths. For example, it may be useful to detect a range (or multiple ranges) of SWIR wavelengths that include SWIR wavelengths between about 1.4-1.5 μm and about 2.5 μm. This range includes two windows in which SWIR wavelengths are not absorbed (or conversely, are transmitted). A first window, or range of transmitted SWIR wavelengths, extends from about 1.4-1.5 μm to about 1.85 μm. A second window, or range of transmitted SWIR wavelengths, extends from about 2.0 μm to about 2.5 μm. These windows/ranges are illustrated in FIG. 1. SWIR wavelengths between these two windows (i.e., SWIR wavelengths of about 1.85 μm to about 2.0 μm) are absorbed by water.

InGaAs electromagnetic radiation detectors (hereafter simply referred to as InGaAs detectors, or simply detectors) can be used to detect SWIR wavelengths in the range of about 1.4-2.5 μm but, at least conventionally, a single-absorber BSI-configured InGaAs detector has been unable to detect SWIR wavelengths at the low end of this range with high SNR. To detect electromagnetic radiation within a wider range of SWIR wavelengths using a single detector, or to detect different ranges of SWIR wavelengths using a single detector, a new type of SWIR electromagnetic radiation detector is needed. Although an FSI-configured InGaAs detector can detect a larger range of SWIR wavelengths, and does not suffer from buffer absorption, an immersion condenser lens cannot be formed on an FSI-configured InGaAs detector. An InGaAs detector with an immersion condenser lens will typically be able to achieve a higher SNR by concentrating received wavelengths of electromagnetic radiation into a smaller area than would otherwise be possible.

In some cases, the techniques described herein may be used to construct electromagnetic radiation detectors that can detect electromagnetic radiation wavelengths in other spectral ranges. These other ranges may include ranges that include, overlap, or are disjoint from SWIR wavelengths.

Figure 2A:
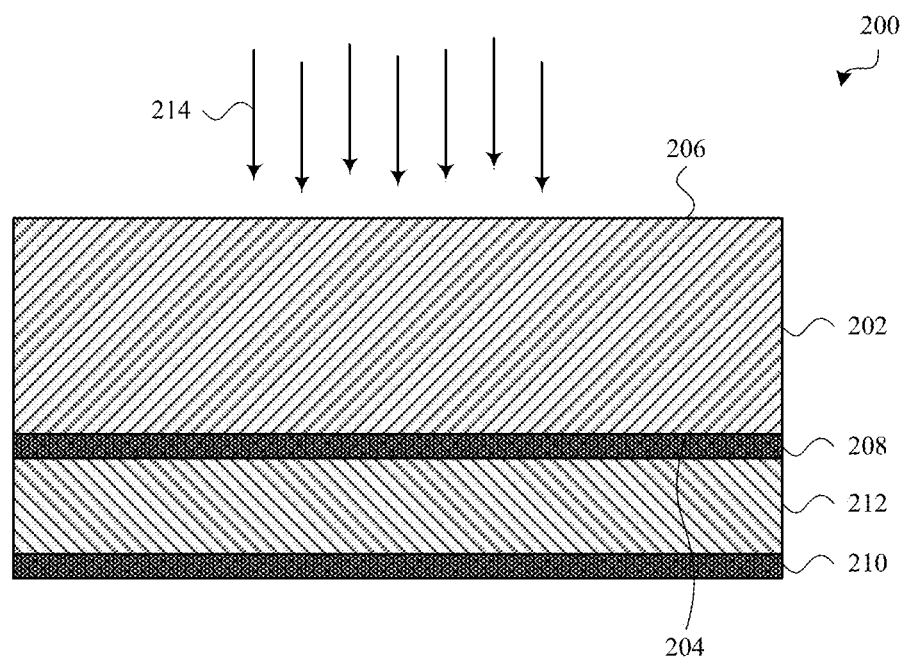
FIG. 2A shows a first example of an InGaAs detector.

FIG. 2A shows a first example of an InGaAs detector 200. The detector 200 includes an InP substrate 202 having a first surface 204 opposite a second surface 206. A number of InGaAs electromagnetic radiation absorbers 208, 210 and other structures (e.g., a set of one or more buffer layers 212) may be formed on the first surface 204, and electromagnetic radiation 214 may be received into the detector 200 by means of electromagnetic radiation 214 impinging on and passing through the second surface 206. The reception of electromagnetic radiation 214 through the second surface 206, and subsequent propagation of electromagnetic radiation 214 through the InP substrate 202 before it impinges on the InGaAs electromagnetic radiation absorbers 208, 210 stacked on the first surface 204, makes the detector 200 a back-illuminated InGaAs detector.

A first InGaAs electromagnetic radiation absorber 208 may be stacked on the first surface 204 of the InP substrate 202, and more particularly may be epitaxially grown directly on the first surface 204 as a lattice-matched InGaAs layer (i.e., a layer that is lattice-matched to the InP substrate). A p-n junction may be formed in the first InGaAs electromagnetic radiation absorber 208 via implantation and/or doping during epitaxial growth.

A set of one or more buffer layers 212 may be stacked on the first InGaAs electromagnetic radiation absorber 208. More particularly, and in some embodiments, each buffer layer may be grown directly on the first InGaAs electromagnetic radiation absorber 208, or on another one of the buffer layers 212. Each buffer layer may be a layer of InAsP for example, and each successive buffer layer may be grown in a graded configuration to transition a lattice constant from a first value of the first InGaAs electromagnetic radiation absorber 208 toward a second value of the second InGaAs electromagnetic radiation absorber 210.

A second InGaAs electromagnetic radiation absorber 210 may be stacked on the set of one or more buffer layers 212, and more particularly may be epitaxially grown directly on one of the buffer layers. The second InGaAs electromagnetic radiation absorber 210 may be grown on a buffer layer as a non-latticed matched InGaAs layer (i.e., as a layer that is non-lattice-matched to the InP substrate 202 (e.g., an extended or strained InGaAs layer)), but may have a lattice constant that is substantially matched to that of the buffer layer on which it is grown. Thus, the second InGaAs electromagnetic radiation absorber 210 may experience a lattice-constant environment (and hence the performance) that it would normally have as an absorber in isolation. A p-n junction may be formed in the second InGaAs electromagnetic radiation absorber 210 via implantation, with doping during epitaxial growth, and/or with diffusion doping. A p-n junction may also be formed in a cap layer of InAsP instead of in the InGaAs electromagnetic radiation absorber 210 itself.

The second InGaAs electromagnetic radiation absorber 210 may have a smaller band gap than the set of one or more buffer layers 212.

When electromagnetic radiation 214 impinges on the second surface 206 of the InP substrate 202, some or all of the electromagnetic radiation 214 may pass through the InP substrate 202 and be absorbed by the first InGaAs electromagnetic radiation absorber 208. For example, a first set of electromagnetic radiation wavelengths (e.g., a first range of electromagnetic radiation wavelengths) may pass through the InP substrate 202 and be absorbed by the first InGaAs electromagnetic radiation absorber 208. Some of the electromagnetic radiation 214 that impinges on the first InGaAs electromagnetic radiation absorber 208 may pass through the first InGaAs electromagnetic radiation absorber 208 without being absorbed, or with minimal absorption, and be absorbed by the set of one or more buffer layers 212. The electromagnetic radiation absorbed by the set of one or more buffer layers 212 may include at least some of the first set of electromagnetic radiation wavelengths. The electromagnetic radiation absorbed by the set of one or more buffer layers 212 may also include other electromagnetic radiation wavelengths. Some of the electromagnetic radiation that impinges on the first InGaAs electromagnetic radiation absorber 208 may also pass through the set of one or more buffer layers 212 and impinge on the second InGaAs electromagnetic radiation absorber 210. At least some of this electromagnetic radiation (e.g., a second set of electromagnetic radiation wavelengths, such as a second range of electromagnetic radiation wavelengths) may be absorbed by the second InGaAs electromagnetic radiation absorber 210. The second set of electromagnetic radiation wavelengths may include at least some electromagnetic radiation wavelengths that are not in the first set of electromagnetic radiation wavelengths and, in some cases, may only include electromagnetic radiation wavelengths that are not in the first set of electromagnetic radiation wavelengths. The second set of electromagnetic radiation wavelengths generally includes longer wavelengths than the first set of wavelengths.

In some embodiments, the first InGaAs electromagnetic radiation absorber 208 may be configured to absorb electromagnetic radiation wavelengths in the range of about 1.4 μm to about 1.7 μm, and the second InGaAs electromagnetic radiation absorber 210 may be configured to absorb electromagnetic radiation wavelengths in the range of about 1.7 μm to about 2.5 μm. For purposes of this description, a material or layer, such as an electromagnetic radiation absorber, is considered to "absorb" an electromagnetic radiation wavelength if it has a responsivity of 0.5 Amperes/Watt (A/W) or greater for the electromagnetic radiation wavelength (and preferably, a responsivity of 0.6 A/W or 0.7 A/W or greater); or in the case of a buffer or buffer layer, if the buffer or buffer layer has an equivalent absorption in some arbitrary units (a.u.). Also for purposes of this description, "about" a particular electromagnetic radiation wavelength is considered to be within +/−50 nanometers (nm) of the particular electromagnetic radiation wavelength.

Figure 2B:
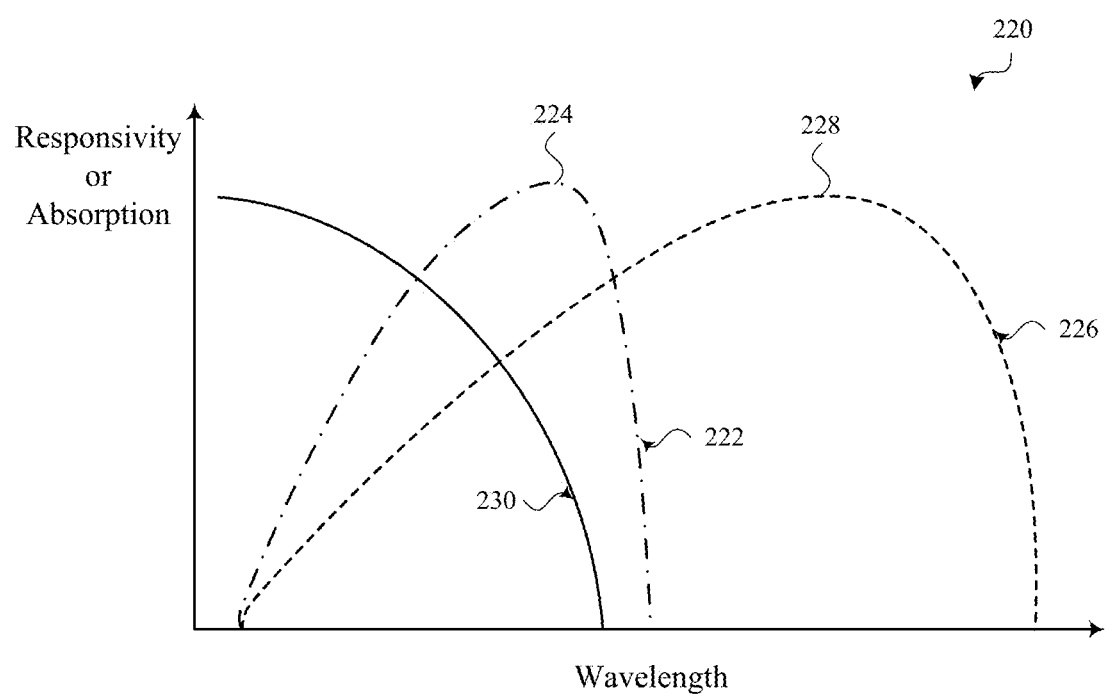
FIG. 2B shows example responsivities of the absorbers of the InGaAs detector described with reference to FIG. 2A.

FIG. 2B shows example responsivities 220 of the absorbers of the InGaAs detector described with reference to FIG. 2A.

The first InGaAs electromagnetic radiation absorber 208 has a first responsivity 222 and may absorb a particular range of electromagnetic radiation wavelengths about a first electromagnetic radiation wavelength 224.

The second InGaAs electromagnetic radiation absorber 210 has a second responsivity 226 and may absorb a particular range of electromagnetic radiation wavelengths about a second electromagnetic radiation wavelength 228. As shown, the second InGaAs electromagnetic radiation absorber 210 may generally absorb longer electromagnetic radiation wavelengths than the first InGaAs electromagnetic radiation absorber 208. Because electromagnetic radiation impinges on the first InGaAs electromagnetic radiation absorber 208 first, and only impinges on the second InGaAs electromagnetic radiation absorber 210 after passing through the first InGaAs electromagnetic radiation absorber 208, fewer (or in some cases none) of the electromagnetic radiation wavelengths absorbed by the first InGaAs electromagnetic radiation absorber 208 may impinge on (and be absorbed by) the second InGaAs electromagnetic radiation absorber 210. In other embodiments, the absorption ranges of the first and second InGaAs electromagnetic radiation absorbers 208, 210 may not overlap (e.g., they may be disjoint).

The set of one or more buffer layers 212 is associated with an absorption (or buffer loss) 230. The absorption range of the one or more buffer layers 212 may overlap some or all of the absorption range of the first InGaAs electromagnetic radiation absorber 208, and in some cases may overlap some (but not all) of the absorption range of the second InGaAs electromagnetic radiation absorber 210. Because electromagnetic radiation impinges on the first InGaAs electromagnetic radiation absorber 208 first, and only impinges on the set of one or more buffer layers 212 after impinging on the first InGaAs electromagnetic radiation absorber 208, electromagnetic radiation within the absorption range of the first InGaAs electromagnetic radiation absorber 208 may be absorbed by the first InGaAs electromagnetic radiation absorber 208 before it is absorbed by the set of one or more buffer layers 212, thereby avoiding the impact of buffer absorption loss on the first InGaAs electromagnetic radiation absorber 208. Also, the set of one or more buffer layers 212 may absorb some or all of the electromagnetic radiation that could be absorbed by the first InGaAs electromagnetic radiation absorber 208, but is not absorbed by the first InGaAs electromagnetic radiation absorber 208, so that the responsivity of the second InGaAs electromagnetic radiation absorber 210 is more specifically tuned to an absorption range that does not overlap the absorption range of the first InGaAs electromagnetic radiation absorber (though some overlap in the electromagnetic radiation wavelengths absorbed by the first and second InGaAs electromagnetic radiation absorbers 208, 210 is possible and even likely.

Figure 3A:
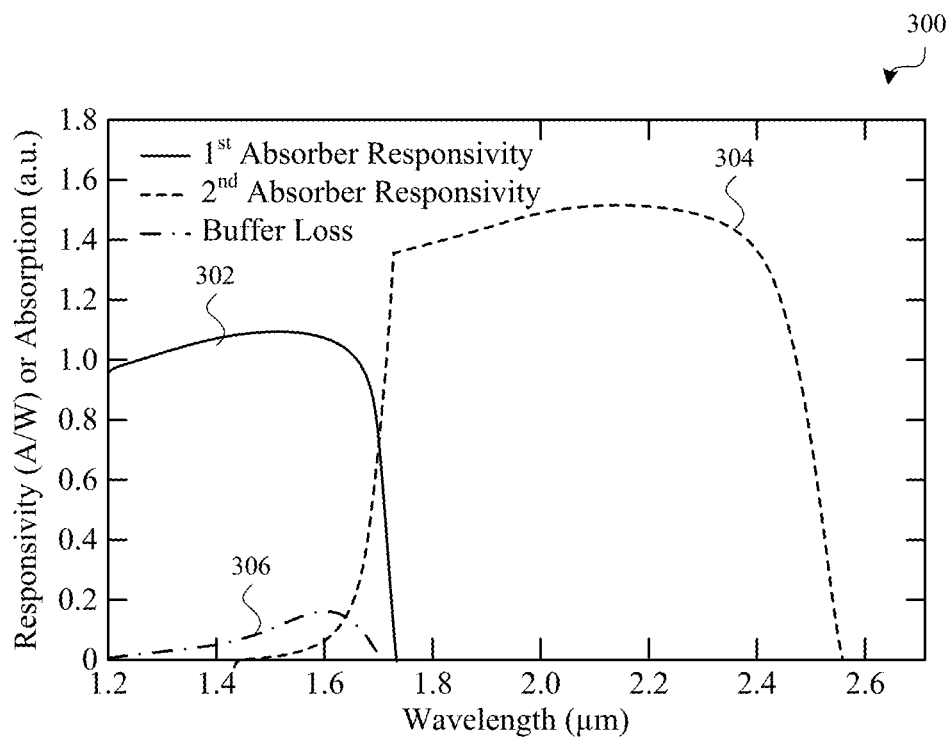
FIG. 3A shows example responsivities for one particular embodiment of an InGaAs detector that is constructed as described with reference to FIG. 2A.
Figure 3B:
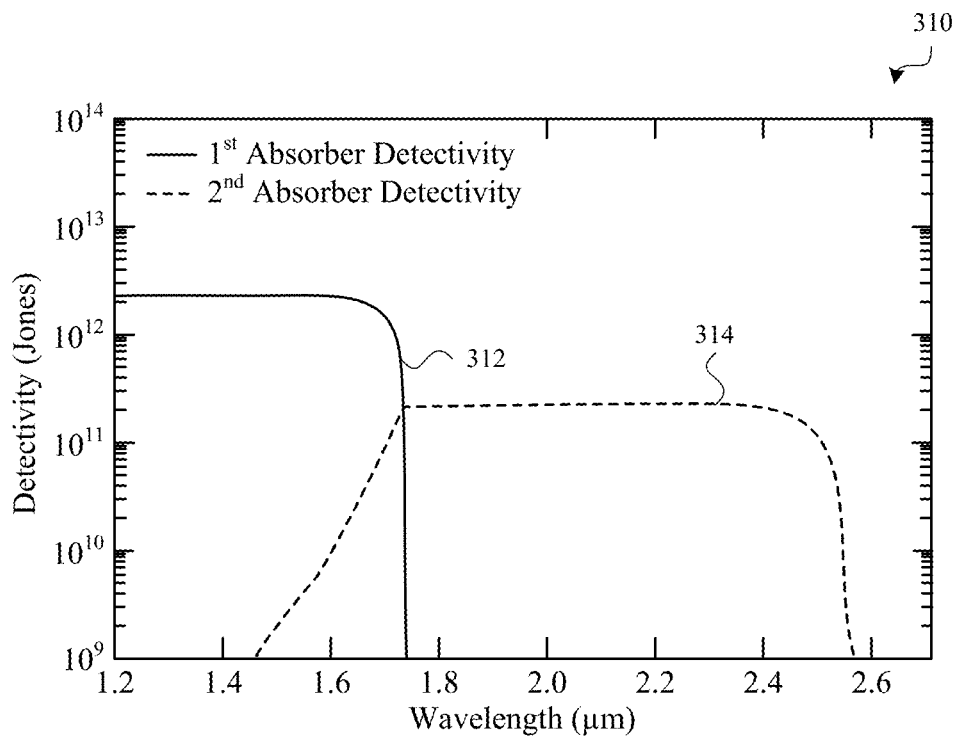
FIG. 3B shows example detectivities for the particular embodiment described with reference to FIG. 3A.

FIG. 3A shows example responsivities 300 for one particular embodiment of an InGaAs detector that is constructed as described with reference to FIG. 2A. FIG. 3B shows example detectivities 310 for the particular embodiment. As shown in FIG. 3A, the first InGaAs electromagnetic radiation absorber 208 has a responsivity 302 with an absorption cut-off at about 1.7 μm, and may have an absorption range that extends to below 1.2 μm (and in some cases to the beginning of the optical spectrum). The second InGaAs electromagnetic radiation absorber 210 has a responsivity 304 that extends from about 1.4 μm to about 2.5 μm, with an absorption cut-on of about 1.7 μm. The responsivities 302, 304 of the first and second InGaAs electromagnetic radiation absorbers 208, 210 therefore intersect (i.e., have a crossover point) at about 1.7 μm.

The set of one or more buffer layers 212 is associated with an absorption (or buffer loss) 306 that overlaps a portion of the first InGaAs electromagnetic radiation absorber's responsivity 302.

As shown in FIG. 3B, the detectivity 312 of the first InGaAs electromagnetic radiation absorber 208 (in Jones) is higher (as between the first and second InGaAs electromagnetic radiation absorbers 208, 210) below about 1.7 μm, and the detectivity 314 of the second InGaAs electromagnetic radiation absorber 210 is higher between about 1.7 μm and 2.5 μm. The InGaAs detector described with reference to FIGS. 3A and 3B can be advantageous in that its first InGaAs electromagnetic radiation absorber is lattice-matched to its InP substrate, and there is no buffer layer that might interfere with the first InGaAs electromagnetic radiation absorber by, for example, increasing the dark current that may interfere with a readout of the current it generates in response to its absorption of electromagnetic radiation within its absorption range. Also, shorter-wavelength (i.e., larger bandgap) semiconductors generally have low dark current densities.

In some cases, it may be desirable to adjust the range of electromagnetic radiation wavelengths to which an absorber is responsive (i.e., the range of electromagnetic radiation wavelengths that the absorber absorbs). In some cases, the responsivity of an InGaAs electromagnetic radiation absorber that is farther from an InP substrate may be adjusted by adjusting the number or thickness of the one or more buffer layers that separate it from an InGaAs electromagnetic radiation absorber that is positioned earlier in an electromagnetic radiation propagation path. In some cases, the responsivity of an InGaAs electromagnetic radiation absorber that is positioned closest to an InP substrate may be adjusted by separating it from the InP substrate by an additional set of one or more buffer layers, as described below with reference to FIGS. 4A and 4B for example. In some cases, the responsivity of an InGaAs electromagnetic radiation absorber may be adjusted by altering its composition or growth method, and/or by adjusting the number, thickness, or type of buffer layers that separate it from an InP substrate or other InGaAs electromagnetic radiation absorber.

Figure 4A:
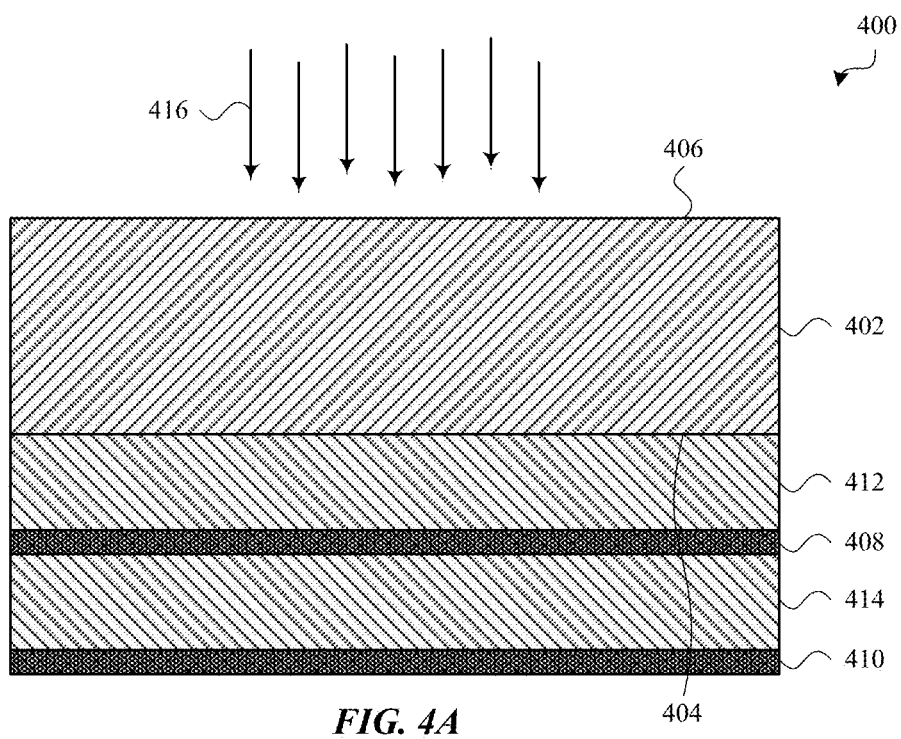
FIG. 4A shows a second example of an InGaAs detector.

FIG. 4A shows a second example of an InGaAs detector 400. The detector 400 includes an InP substrate 402 having a first surface 404 opposite a second surface 406. A number of InGaAs electromagnetic radiation absorbers 408, 410 and other structures (e.g., one or more sets of buffer layers 412, 414) may be formed on the first surface 404, and electromagnetic radiation 416 may be received into the detector 400 by means of electromagnetic radiation 416 impinging on and passing through the second surface 406. The reception of electromagnetic radiation 416 through the second surface 406, and subsequent propagation of electromagnetic radiation 416 through the InP substrate 402 before it impinges on the InGaAs electromagnetic radiation absorbers 408, 410 stacked on the first surface 404, makes the detector 400 a back-illuminated InGaAs detector.

A first set of one or more buffer layers 412 may be stacked on the first surface 404 of the InP substrate 402. More particularly, and in some embodiments, each buffer layer in the first set may be epitaxially grown directly on the InP substrate 402, or on another one of the buffer layers 412. Each buffer layer may be a layer of InAsP for example, and each successive buffer layer may be grown in a graded configuration to transition a lattice constant from a first value of the InP substrate 402 toward a second value of the first InGaAs electromagnetic radiation absorber 408.

A first InGaAs electromagnetic radiation absorber 408 may be stacked on the first set of one or more buffer layers 412, with the buffer layer(s) 412 disposed between the InP substrate 402 and the first InGaAs electromagnetic radiation absorber 408. More particularly, and in some embodiments, the first InGaAs electromagnetic radiation absorber 408 may be epitaxially grown directly on a buffer layer in the first set of one or more buffer layers 412 as a short lattice-mismatched InGaAs layer (i.e., as a layer that is lattice-mismatched to the InP substrate), but may have a lattice constant that is substantially matched to that of the buffer layer on which it is grown. Thus, the first InGaAs electromagnetic radiation absorber 408 may experience a lattice-constant environment (and hence the performance) that it would normally have as an absorber in isolation. A p-n junction may be formed in the first InGaAs electromagnetic radiation absorber 408 via implantation, with doping during epitaxial growth, and/or with diffusion doping. A p-n junction may also be formed in a cap layer of InAsP instead of in the InGaAs electromagnetic radiation absorber 410 itself.

A second set of one or more buffer layers 414 may be stacked on the first InGaAs electromagnetic radiation absorber 408. More particularly, and in some embodiments, each buffer layer in the set may be epitaxially grown directly on the first InGaAs electromagnetic radiation absorber 408, or on another one of the buffer layers 414. Each buffer layer may be a layer of InAsP for example, and each successive buffer layer may be grown in a graded configuration to transition a lattice constant from a first value of the first InGaAs electromagnetic radiation absorber 408 toward a second value of the second InGaAs electromagnetic radiation absorber 410.

A second InGaAs electromagnetic radiation absorber 410 may be stacked on the second set of one or more buffer layers 414, with the buffer layer(s) 414 disposed between the first InGaAs electromagnetic radiation absorber 408 and the second InGaAs electromagnetic radiation absorber 410. More particularly, and in some embodiments, the second InGaAs electromagnetic radiation absorber 410 may be epitaxially grown on a buffer layer in the second set of one or more buffer layers 414 as a long or extended latticed mismatched InGaAs layer (i.e., as a layer that is non-lattice-matched to the InP substrate 402 (e.g., an extended or strained InGaAs layer)), but may have a lattice constant that is substantially matched to that of the buffer layer on which it is grown. Thus, the second InGaAs electromagnetic radiation absorber 410 may experience a lattice-constant environment (and hence the performance) that it would normally have as an absorber in isolation. A p-n junction may be formed in the second InGaAs electromagnetic radiation absorber 410 via implantation, with doping during epitaxial growth, and/or with diffusion doping. A p-n junction may also be formed in a cap layer of InAsP instead of in the InGaAs electromagnetic radiation absorber 410 itself.

The first InGaAs electromagnetic radiation absorber 408 may have a larger band gap than the first set of one or more buffer layers 412. Similarly, the second InGaAs electromagnetic radiation absorber 410 may have a larger band gap than the second set of one or more buffer layers 414. This enables each InGaAs electromagnetic radiation absorber 408, 410 to absorb longer electromagnetic radiation wavelengths that are absorbed by layers that are closer to the InP substrate 402.

When electromagnetic radiation 416 impinges on the second surface 406 of the InP substrate 402, some or all of the electromagnetic radiation 416 may pass through the InP substrate 402 and be absorbed by the first InGaAs electromagnetic radiation absorber 408. For example, a first set of electromagnetic radiation wavelengths (e.g., a first range of electromagnetic radiation wavelengths) may pass through the InP substrate 402 and be absorbed by the first InGaAs electromagnetic radiation absorber 408. The set of electromagnetic radiation wavelengths that is absorbed by the first InGaAs electromagnetic radiation absorber 408 may be influenced by the absorption range of the first set of one or more buffer layers 412. For example, electromagnetic radiation wavelengths that are absorbed by the first set of buffer layers 412 will not impinge on the first InGaAs electromagnetic radiation absorber 408. In some cases, the first set of one or more buffer layers 412 may be used to adjust (or tune) one or both bounds of a range of electromagnetic radiation wavelengths absorbed by the first InGaAs electromagnetic radiation absorber 408.

Some of the electromagnetic radiation 416 that impinges on the first InGaAs electromagnetic radiation absorber 408 may pass through the first InGaAs electromagnetic radiation absorber 408 without being absorbed, or with minimal absorption, and be absorbed by the second set of one or more buffer layers 414. The electromagnetic radiation absorbed by the second set of one or more buffer layers 414 may include at least some of the first set of electromagnetic radiation wavelengths. The electromagnetic radiation absorbed by the second set of one or more buffer layers 414 may also include other electromagnetic radiation wavelengths. Some of the electromagnetic radiation that impinges on the first InGaAs electromagnetic radiation absorber 408 may also pass through the second set of one or more buffer layers 414 and impinge on the second InGaAs electromagnetic radiation absorber 410. At least some of this electromagnetic radiation (e.g., a second set of electromagnetic radiation wavelengths, such as a second range of electromagnetic radiation wavelengths) may be absorbed by the second InGaAs electromagnetic radiation absorber 410. The second set of electromagnetic radiation wavelengths may include at least some electromagnetic radiation wavelengths that are not in the first set of electromagnetic radiation wavelengths and, in some cases, may only include electromagnetic radiation wavelengths that are not in the first set of electromagnetic radiation wavelengths. The second set of electromagnetic radiation wavelengths generally includes longer wavelengths than the first set of wavelengths.

In some embodiments, the first InGaAs electromagnetic radiation absorber 408 may be configured to absorb electromagnetic radiation wavelengths in the range of about 1.4 µm to about 1.9 µm or 2.0 µm, and the second InGaAs electromagnetic radiation absorber 410 may be configured to absorb electromagnetic radiation wavelengths in the range of about 1.9 µm or 2.0 µm to about 2.5 µm. Configuring the cut-off of the absorption range of the first InGaAs electromagnetic radiation detector within a range of about 1.85 µm to about 2.0 µm (i.e., a band in which electromagnetic radiation is largely absorbed by water, as discussed with reference to FIG. 1), and configuring the cut-on of the absorption range of the second InGaAs electromagnetic radiation detector within the same range, places the crossover between absorber responsivities within a range of electromagnetic radiation wavelengths where little useful sensing can be performed (at least in some applications).

Figure 4B:
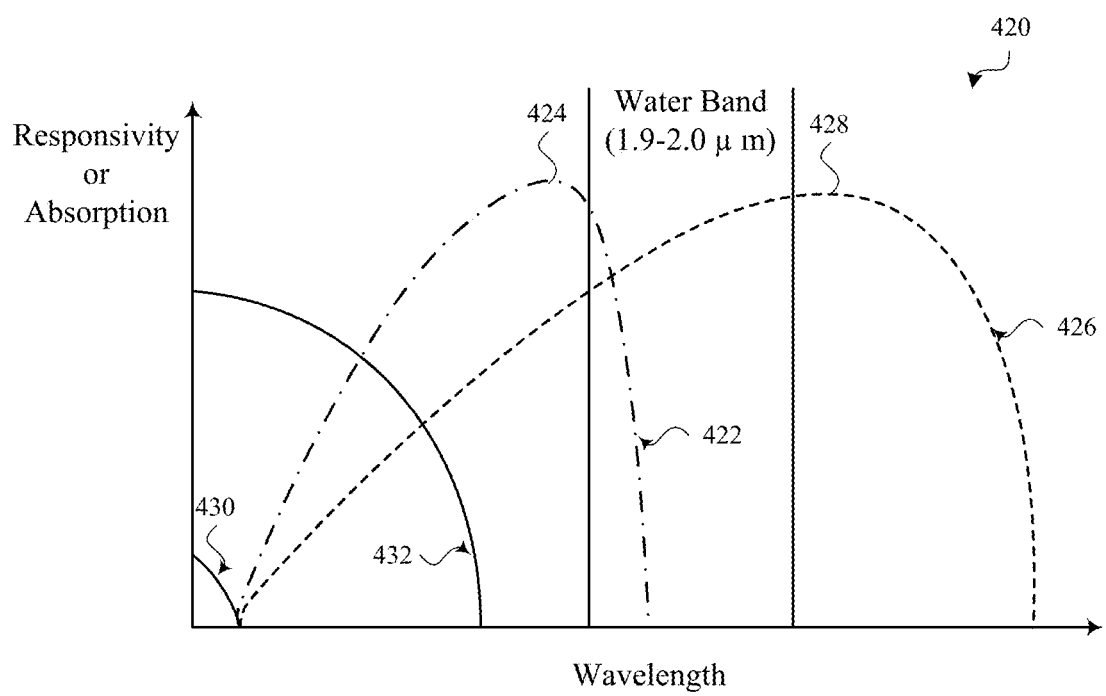
FIG. 4B shows example responsivities of the absorbers of the InGaAs detector described with reference to FIG. 4A.

FIG. 4B shows example responsivities 420 of the absorbers of the InGaAs detector described with reference to FIG. 4A.

The first InGaAs electromagnetic radiation absorber 408 has a first responsivity 422 and may absorb a particular range of electromagnetic radiation wavelengths about a first electromagnetic radiation wavelength 424.

The second InGaAs electromagnetic radiation absorber 410 has a second responsivity 426 and may absorb a particular range of electromagnetic radiation wavelengths about a second electromagnetic radiation wavelength 428. As shown, the second InGaAs electromagnetic radiation absorber 410 may generally absorb longer electromagnetic radiation wavelengths than the first InGaAs electromagnetic radiation absorber 408. Because electromagnetic radiation impinges on the first InGaAs electromagnetic radiation absorber 408 first, and only impinges on the second InGaAs electromagnetic radiation absorber 410 after passing through the first InGaAs electromagnetic radiation absorber 408, fewer (or in some cases none) of the electromagnetic radiation wavelengths absorbed by the first InGaAs electromagnetic radiation absorber 408 may impinge on (and be absorbed by) the second InGaAs electromagnetic radiation absorber 410. In other embodiments, the absorption ranges of the first and second InGaAs electromagnetic radiation absorbers 408, 410 may not overlap (e.g., they may be disjoint).

The first set of one or more buffer layers 412 is associated with an absorption (or buffer loss) 430. The absorption range of the first set of one or more buffer layers 412 may be negligible, and may be generally outside the absorption ranges of the first and second InGaAs electromagnetic radiation absorbers 408, 410.

The second set of one or more buffer layers 414 is associated with an absorption (or buffer loss) 432. The absorption range of the second set of one or more buffer layers 414 may overlap some or all of the absorption range of the first InGaAs electromagnetic radiation absorber 408, and in some cases may overlap some (but not all) of the absorption range of the second InGaAs electromagnetic radiation absorber 410. Because electromagnetic radiation impinges on the first InGaAs electromagnetic radiation absorber 408 first, and only impinges on the second set of one or more buffer layers 414 after impinging on the first InGaAs electromagnetic radiation absorber 408, electromagnetic radiation within the absorption range of the first InGaAs electromagnetic radiation absorber 408 may be absorbed by the first InGaAs electromagnetic radiation absorber 408 before it is absorbed by the second set of one or more buffer layers 414, thereby avoiding the impact of buffer absorption loss on the first InGaAs electromagnetic radiation absorber 408. Also, the second set of one or more buffer layers 414 may absorb some or all of the electromagnetic radiation that could be absorbed by the first InGaAs electromagnetic radiation absorber 408, but is not absorbed by the first InGaAs electromagnetic radiation absorber 408, so that the responsivity of the second InGaAs electromagnetic radiation absorber 410 is more specifically tuned to an absorption range that does not overlap the absorption range of the first InGaAs electromagnetic radiation absorber (though some overlap in the electromagnetic radiation wavelengths absorbed by the first and second InGaAs electromagnetic radiation absorbers 408, 410 is possible and even likely.

Figure 5A:
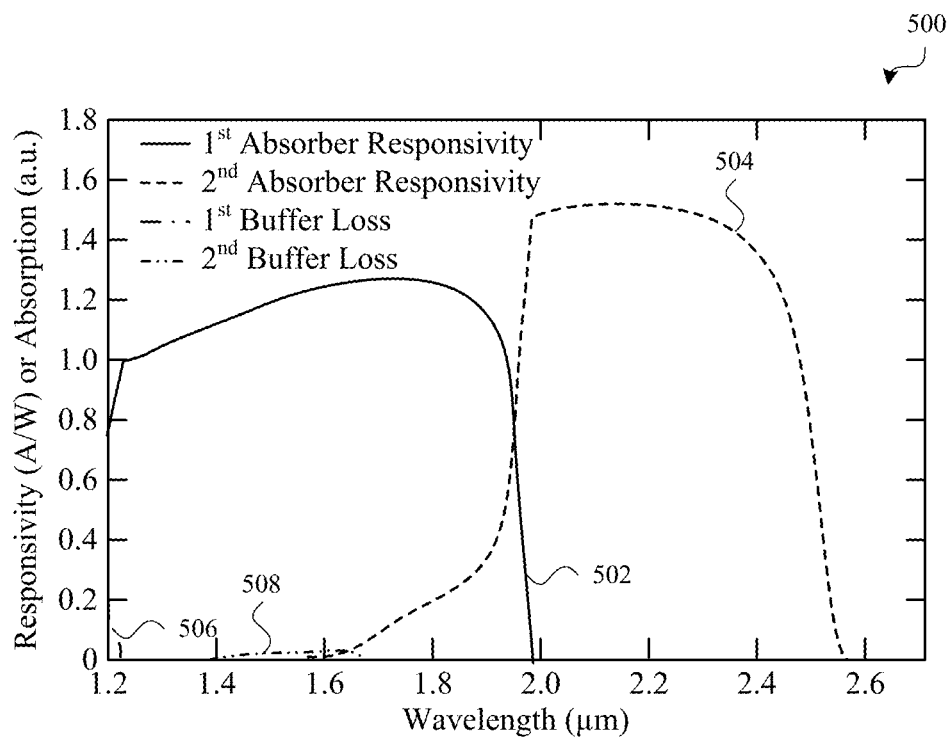
FIG. 5A shows example responsivities for one particular embodiment of an InGaAs detector that is constructed as described with reference to FIG. 4A.
Figure 5B:
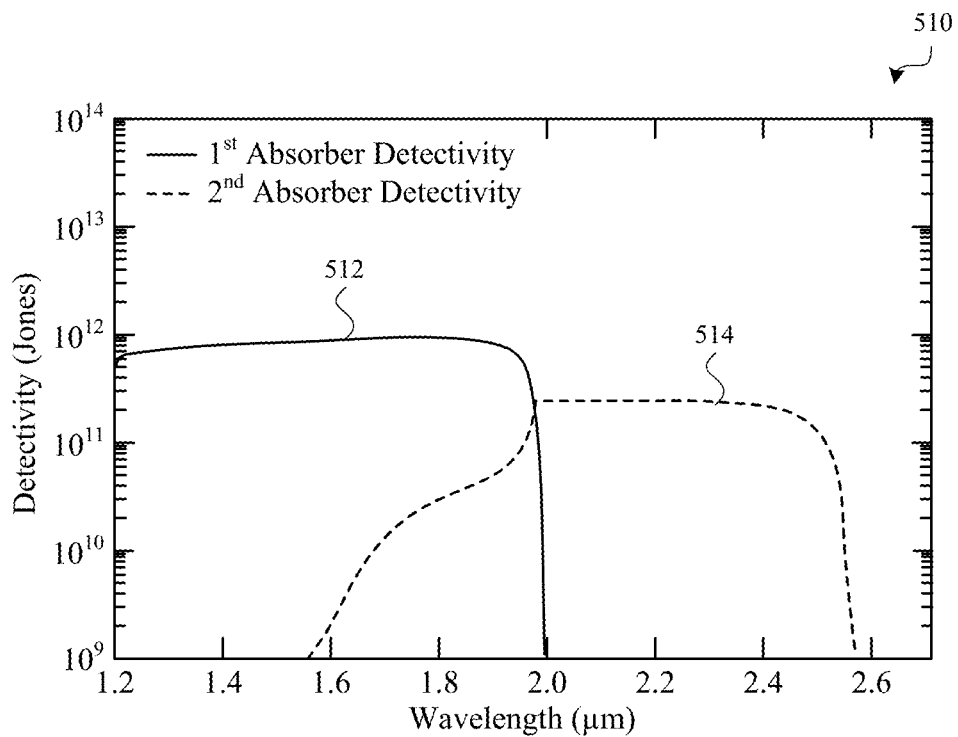
FIG. 5B shows example detectivities for the particular embodiment described with reference to FIG. 5A.

FIG. 5A shows example responsivities 500 for one particular embodiment of an InGaAs detector that is constructed as described with reference to FIG. 4A. FIG. 5B shows example detectivities 510 for the particular embodiment.

As shown in FIG. 5A, the first InGaAs electromagnetic radiation absorber 408 has a responsivity 502 with an absorption cut-off at about 1.9 μm, and may have an absorption range that extends to about 1.2 μm. The second InGaAs electromagnetic radiation absorber 410 has a responsivity 504 that extends from about 1.4 μm to about 2.5 μm, with an absorption cut-on of about 1.9 μm. The responsivities 502, 504 of the first and second InGaAs electromagnetic radiation absorbers 408, 410 therefore intersect (i.e., have a crossover point) at about 1.9 μm.

The first set of one or more buffer layers 412 is associated with an absorption (or buffer loss) 506 that is generally outside the responsivity of the first and second InGaAs electromagnetic radiation detectors 408, 410, and the second set of one or more buffer layers 414 is associated with an absorption (or buffer loss) 508 that overlaps portions of the first and second InGaAs electromagnetic radiation absorber responsivities 502, 504.

As shown in FIG. 5B, the detectivity 512 of the first InGaAs electromagnetic radiation absorber 408 (in Jones) is higher (as between the first and second InGaAs electromagnetic radiation absorbers 408, 410) between about 1.2 μm and 1.9 μm, and the detectivity 514 of the second InGaAs electromagnetic radiation absorber 410 is higher between about 1.9 μm and 2.5 μm.

The InGaAs detector described with reference to FIGS. 5A and 5B can be advantageous in that the crossover point between its first and second InGaAs electromagnetic radiation absorbers is within a water absorption band (e.g., the water absorption band between about 1.85 μm and about 2.0 μm, as described with reference to FIG. 1). In other words, the crossover point is at an electromagnetic radiation wavelength (or wavelength range) where little useful sensing may be done.

Figure 6A:
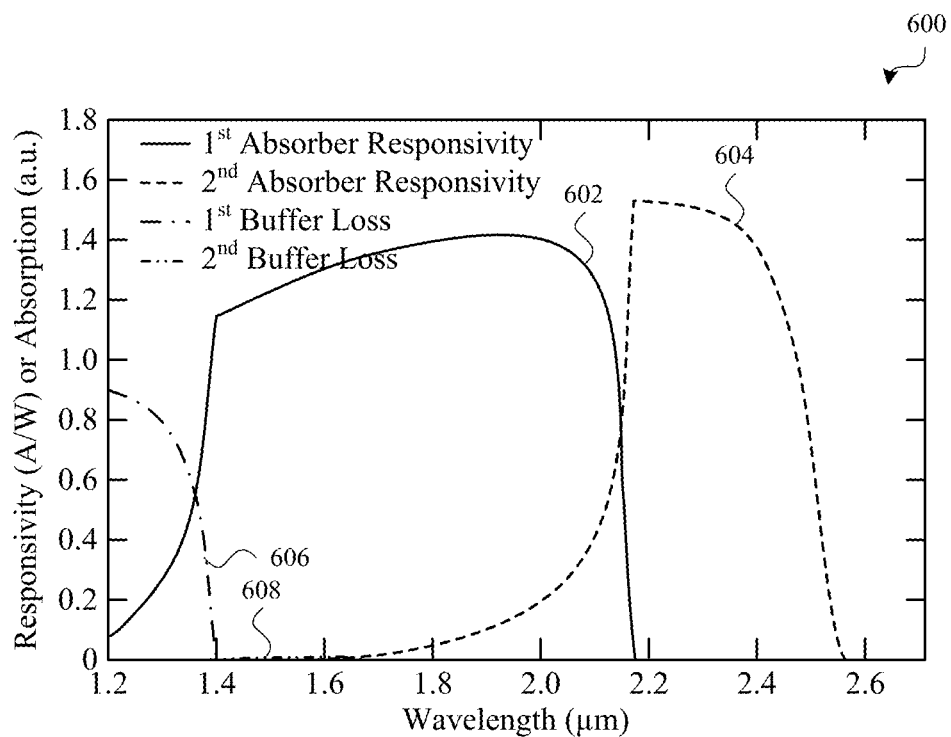
FIG. 6A shows example responsivities for another particular embodiment of an InGaAs detector that is constructed as described with reference to FIG. 4A.
Figure 6B:
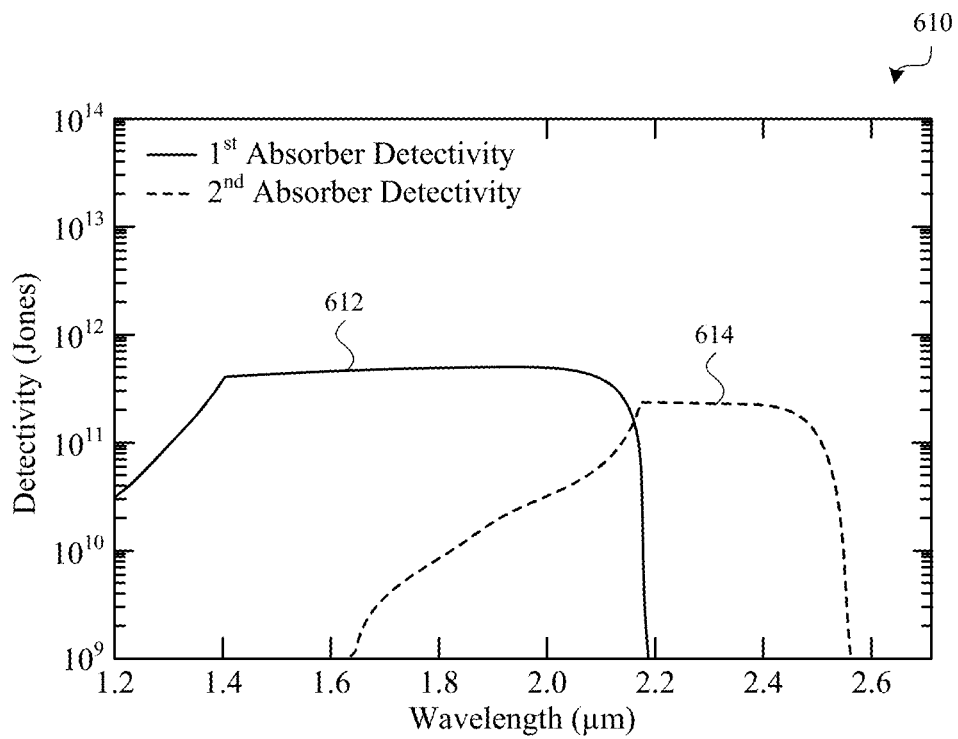
FIG. 6B shows example detectivities for the particular embodiment described with reference to FIG. 6A.

FIG. 6A shows example responsivities 600 for another particular embodiment of an InGaAs detector that is constructed as described with reference to FIG. 4A. FIG. 6B shows example detectivities 610 for the particular embodiment.

As shown in FIG. 6A, the first InGaAs electromagnetic radiation absorber 408 has a responsivity 602 with an absorption cut-off at about 2.1 μm, and may have an absorption range that extends to about 1.4 μm. The second InGaAs electromagnetic radiation absorber 410 has a responsivity 604 that extends from about 1.6 μm to about 2.5 μm, with an absorption cut-on of about 2.1 μm. The responsivities 602, 604 of the first and second InGaAs electromagnetic radiation absorbers 408, 410 therefore intersect (i.e., have a crossover point) at about 2.1 μm.

The first set of one or more buffer layers 412 is associated with an absorption (or buffer loss) 606 that overlaps a portion of the responsivity of the first InGaAs electromagnetic radiation detector 400, and the second set of one or more buffer layers 414 is associated with an absorption (or buffer loss) 608 that overlaps portions of the first and second InGaAs electromagnetic radiation absorber responsivities 602, 604.

As shown in FIG. 6B, the detectivity 612 of the first InGaAs electromagnetic radiation absorber 408 (in Jones) is higher (as between the first and second InGaAs electromagnetic radiation absorbers 408, 410) between about 1.4 μm and 2.1 μm, and the detectivity 614 of the second InGaAs electromagnetic radiation absorber 410 is higher between about 2.1 μm and 2.5 μm.

The InGaAs detector described with reference to FIGS. 6A and 6B can be advantageous in that its first InGaAs electromagnetic radiation absorber has a cut-off at a longer electromagnetic radiation wavelength than the other InGaAs detectors described herein. When the buffer layer(s) through which electromagnetic radiation passes, e.g., to reach the first InGaAs electromagnetic radiation absorber, do not absorb electromagnetic radiation wavelengths in a range of interest (e.g., when the buffer layer(s) only absorb electromagnetic radiation wavelengths below 1.4 μm), there may be less dark current that interferes with a readout of the current it generates in response to its absorption of electromagnetic radiation within its absorption range. The above limitation on the absorption range of the buffer layer(s) closer to the InP substrate may put a constraint on the composition of the buffer layer(s) (e.g., an InAsP composition), and hence on the lattice constant that can be attained, and hence on the composition of the first electromagnetic radiation absorber (e.g., an InGaAs composition), and hence on the long-wavelength cut-off of the first electromagnetic radiation absorber. This design ensures that no absorber's responsivity is degraded by buffer absorption, at any wavelength of interest.

In some embodiments, an InGaAs detector constructed as described with reference to FIG. 2A or 4A may include one or more additional InGaAs electromagnetic radiation absorbers, stacked on one or more additional sets of one or more buffer layers. For example, an InGaAs detector may include a third InGaAs electromagnetic radiation absorber stacked on a third set of one or more buffer layers, which third set of one or more buffer layers may be stacked on the detector's second InGaAs electromagnetic radiation absorber.

In some embodiments, a detector may include a substrate, buffer layer(s), and/or electromagnetic radiation absorbers that include other materials. For example, the substrate may be formed of Gallium Arsenide (GaAs), Cadmium Telluride (CdTe), or Silicon (Si). In the case of GaAs, CdTe, or Si substrates, the electromagnetic radiation absorbers may in some cases be formed of Mercury Cadmium Telluride (HgCdTe).

Figure 7A:
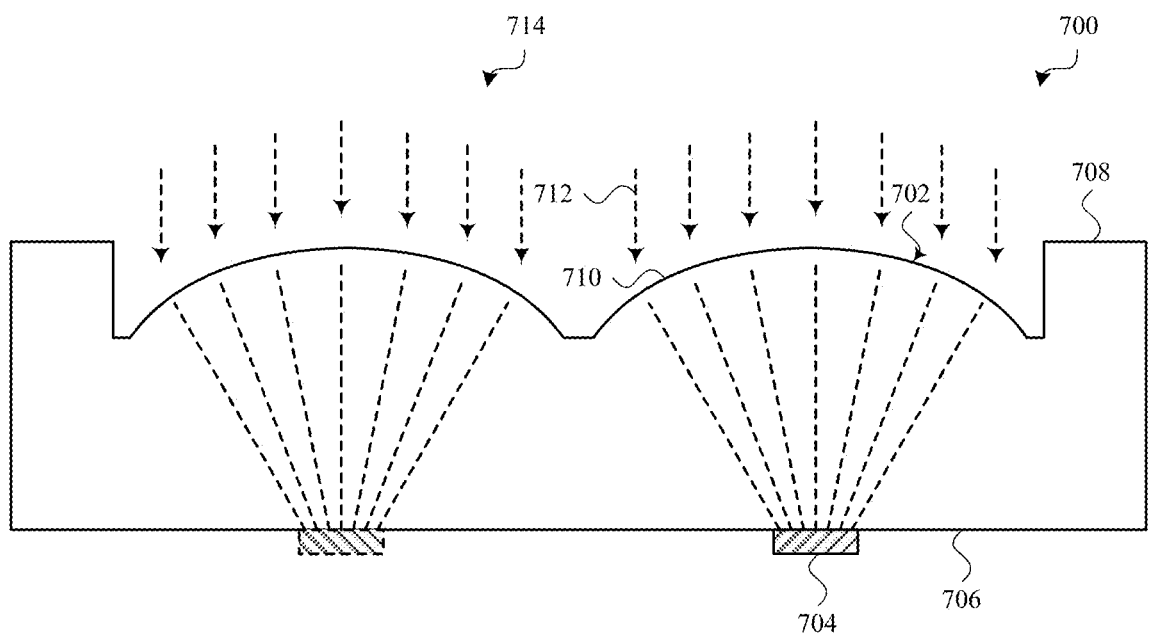
FIG. 7A shows an example use of a back-illuminated InGaAs detector having an immersion condenser lens.

FIG. 7A shows an example use of a back-illuminated InGaAs detector 700 having an immersion condenser lens 702. In some examples, the InGaAs detector 700 may include the InGaAs electromagnetic radiation absorbers and buffer layer(s) described with reference to one or more of FIGS. 2A-6B.

The InGaAs detector 700 may have multiple InGaAs electromagnetic radiation absorbers (i.e., two or more) and one or more sets of one or more buffer layers, collectively labeled 704, stacked (e.g., grown) on a first surface 706 of an InP substrate 708. The InP substrate 708 may have a second surface 710 on which the immersion condenser lens 702 is formed (e.g., etched), such that the InGaAs electromagnetic radiation absorbers and buffer layer(s) 704 are immersed in a continuous high-refractive-index medium (i.e., the InP substrate 708). The immersion condenser lens 702 can improve the transfer of electromagnetic radiation 712 through the InP substrate 708 of the InGaAs detector 700.

The immersion condenser lens 702 may receive electromagnetic radiation 712 through the second surface 710 of the InP substrate 708, which may be a convex surface, and focus the electromagnetic radiation onto the InGaAs electromagnetic radiation absorbers and buffer layers 704.

In some cases, the InGaAs detector 700 may be used as a singular (e.g., stand-alone) detector unit. In other cases, the InGaAs detector 700 may be one detector unit in an array (e.g., a one-dimensional or two-dimensional array) of InGaAs detectors 700, 714 or detector units. The different InGaAs detectors 700, 714 may share a common InP substrate 708 (as shown) and/or other components, or may be separately fabricated (or jointly fabricated and then diced) and mounted on a carrier substrate, or within a housing, for example.

Figure 7B:
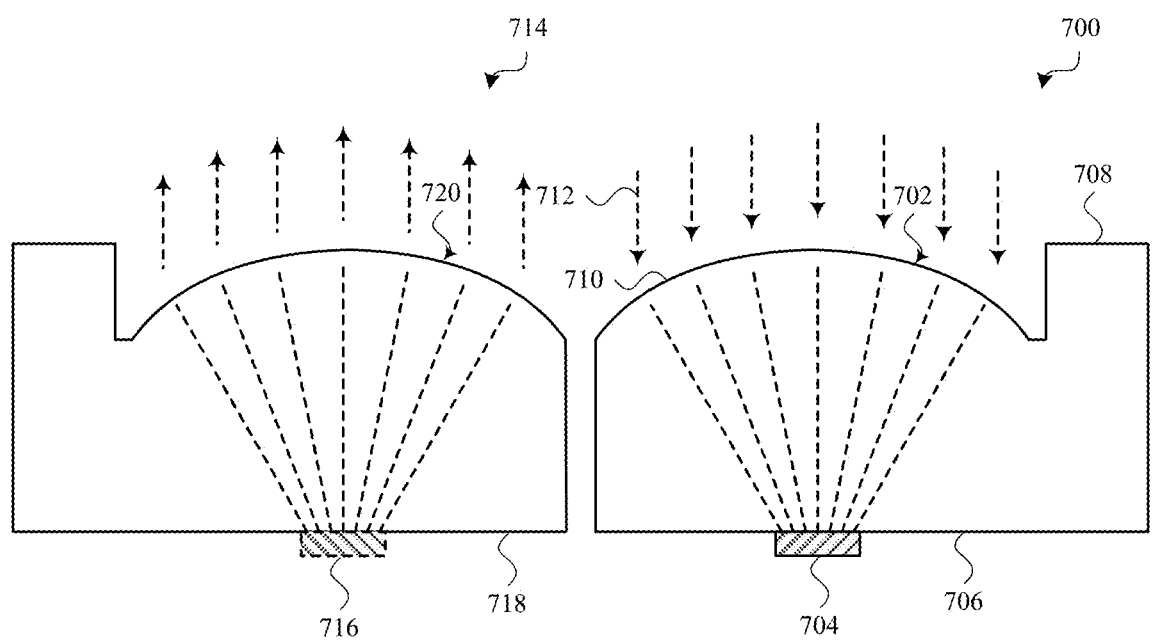
FIG. 7B shows an example use of a back-illuminated InGaAs detector in conjunction with an emitter unit.

In some cases, and as shown in FIG. 7B, the InGaAs detector 700 may be used as a detector unit and positioned near an emitter unit. The emitter unit may include an electromagnetic radiation emitter 716 that is stacked on, or positioned near, a surface 718 of a lens 720 and configured to emit electromagnetic radiation through the lens 720. By way of example, the lens 720 may collimate, spread, or focus the electromagnetic radiation emitted by the electromagnetic radiation emitter 716. The electromagnetic radiation emitter 716 may emit electromagnetic radiation within, throughout, or including the range of electromagnetic radiation that can be absorbed by the InGaAs detector 700. In some embodiments, the lens 720 may not be provided.

FIGS. 8A-11 illustrate various example contact arrangements for an InGaAs detector. By way of example, the contact arrangements are shown for an InGaAs detector similar to the InGaAs detector described with reference to FIG. 4. However, the various contact arrangements may be used for any of the InGaAs detectors described herein.

Figure 8A:
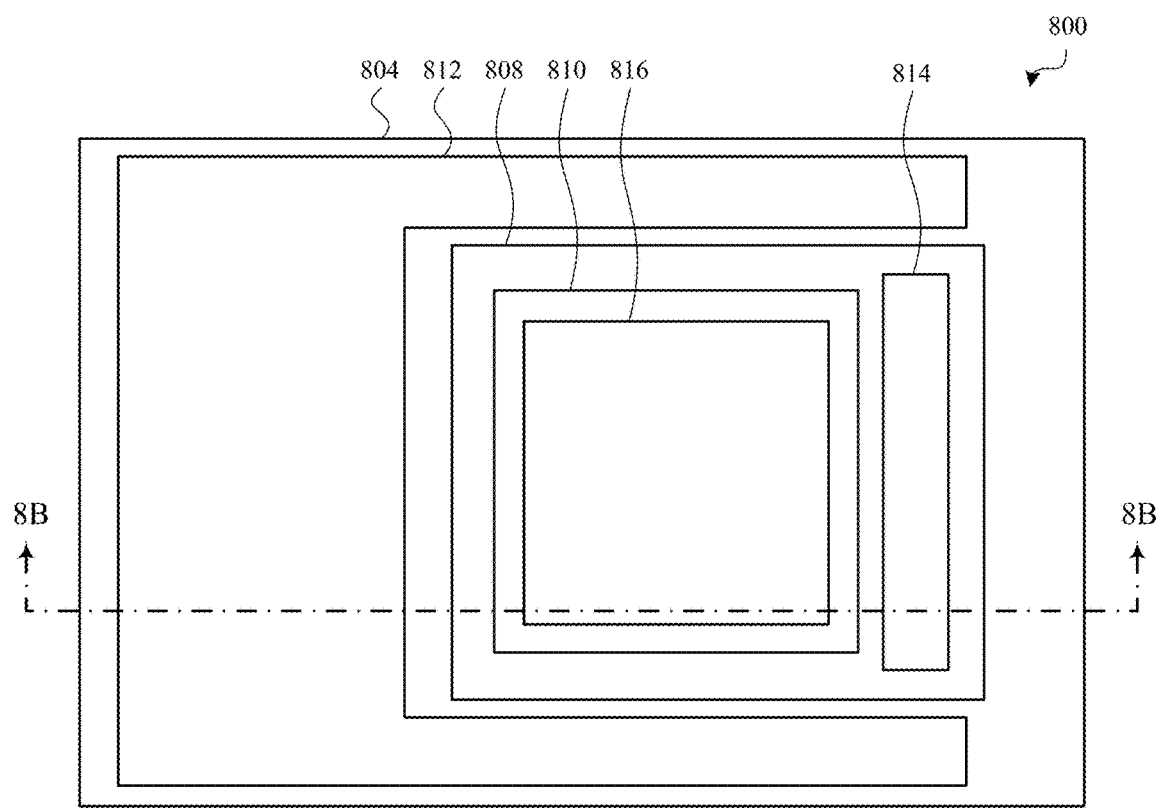
FIGS. 8A-11 illustrate various example contact arrangements for an InGaAs detector.
Figure 8B:
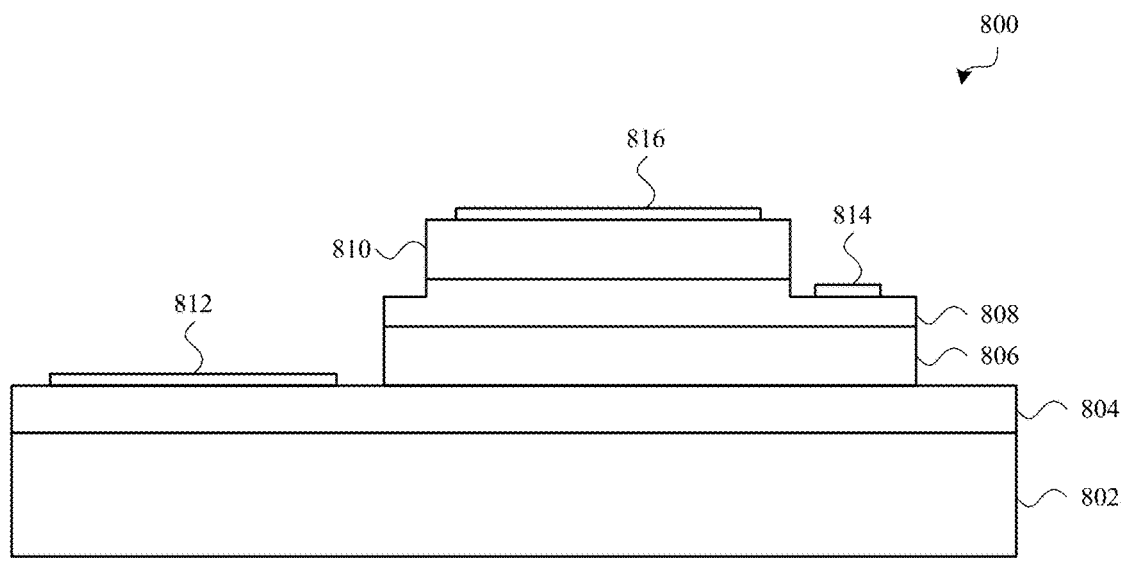

FIG. 8A shows a plan view of a 3-contact InGaAs detector 800, and FIG. 8B shows a cross-sectional elevation of the InGaAs detector 800. The InGaAs detector 800 includes an InP substrate 802 on which an optional first set of one or more buffer layers (collectively referred to as a first buffer 804) is stacked. A first InGaAs electromagnetic radiation absorber 806 is stacked on the first buffer 804 (i.e., with the first buffer 804 disposed between the InP substrate 802 and the first InGaAs electromagnetic radiation absorber 806), or on the InP substrate 802 when the first buffer 804 is not provided. A second set of one or more buffer layers (collectively referred to as a second buffer 808) is stacked on the first InGaAs electromagnetic radiation absorber 806, and a second InGaAs electromagnetic radiation absorber 810 is stacked on the second buffer 808 (i.e., with the second buffer 808 disposed between the first InGaAs electromagnetic radiation absorber 806 and the second InGaAs electromagnetic radiation absorber 810).

The first InGaAs electromagnetic radiation absorber may be electrically disposed between a first electrical contact 812 and a second electrical contact 814, with the first and second electrical contacts 812, 814 being used to electrically bias the first InGaAs electromagnetic radiation absorber 806 and sense a first current generated by the first InGaAs electromagnetic radiation absorber 806. In some embodiments, the first electrical contact 812 may be deposited on the first buffer 804, and the second electrical contact 814 may be deposited on the second buffer 808. In other embodiments, the first electrical contact 812 may be deposited on the InP substrate 802 for example, or the second electrical contact 814 may be deposited on the first InGaAs electromagnetic radiation absorber 806.

The second InGaAs electromagnetic radiation absorber may be electrically disposed between the second electrical contact 814 and a third electrical contact 816, with the second and third electrical contacts 814, 816 being used to electrically bias the second InGaAs electromagnetic radiation absorber 810 and sense a second current generated by the second InGaAs electromagnetic radiation absorber 810. In some embodiments, the third electrical contact 816 may be deposited on the second InGaAs electromagnetic radiation absorber 810.

As shown in FIG. 8A, the first buffer 804 may extend over the entirety of the InP substrate 802, or over a greater portion of the InP substrate 802 than each of the first and second InGaAs electromagnetic radiation absorbers 806, 810 and second buffer 808. The first electrical contact 812 is shown to extend along three sides of the first InGaAs electromagnetic radiation absorber 806, but in other embodiments may be positioned adjacent only one side of the first InGaAs electromagnetic radiation absorber 806, or may surround the first InGaAs electromagnetic radiation absorber 806, or have other configurations. Although the perimeters of all substrate, buffer, and absorber components are shown to be rectangular or square in FIG. 8A, the perimeters of these elements could alternatively have any shape.

Figure 9A:
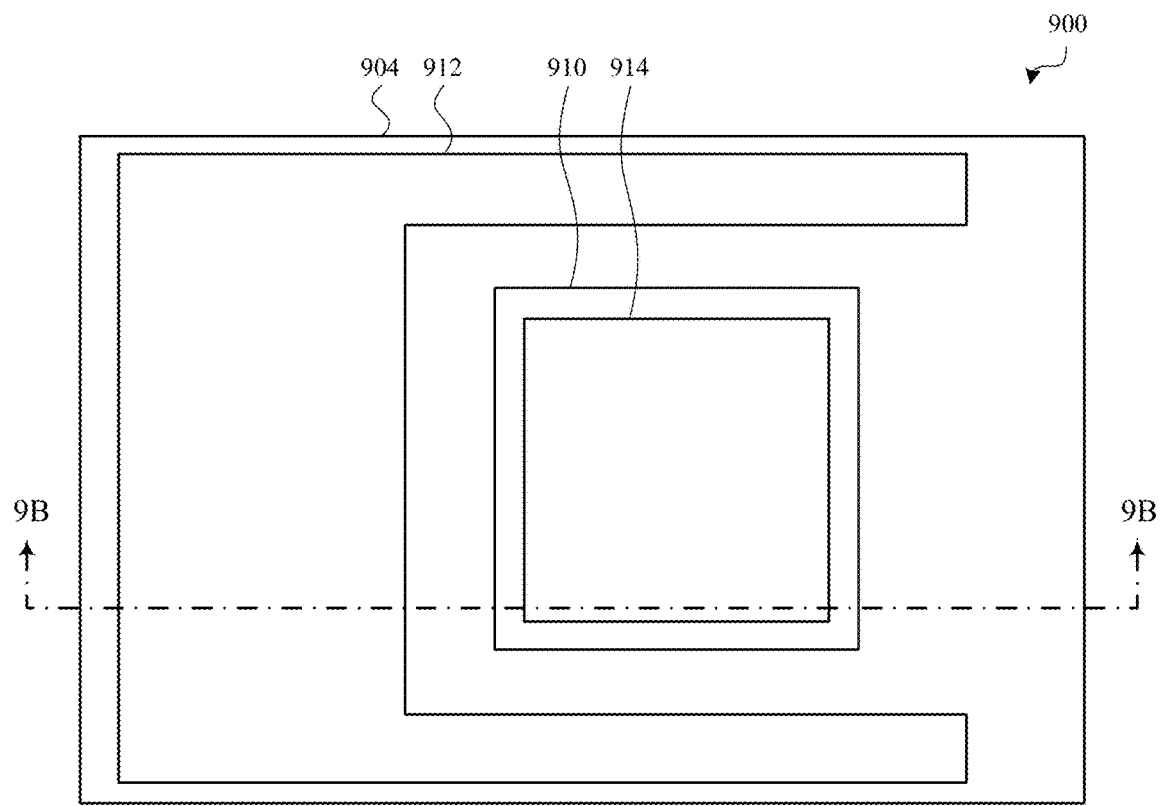
Figure 9B:
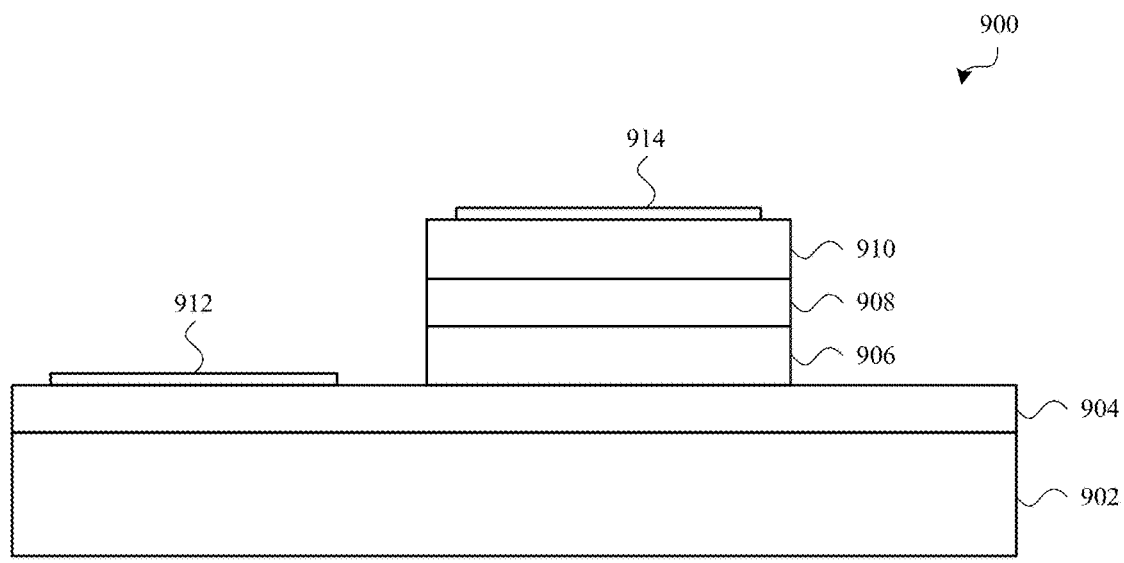

FIG. 9A shows a plan view of a 2-contact InGaAs detector 900, and FIG. 9B shows a cross-sectional elevation of the InGaAs detector 900. The InGaAs detector 900 includes an InP substrate 902 on which an optional first set of one or more buffer layers (collectively referred to as a first buffer 904) is stacked. A first InGaAs electromagnetic radiation absorber 906 is stacked on the first buffer 904 (i.e., with the first buffer 904 disposed between the InP substrate 902 and the first InGaAs electromagnetic radiation absorber 906), or on the InP substrate 902 when the first buffer 904 is not provided. A second set of one or more buffer layers (collectively referred to as a second buffer 908) is stacked on the first InGaAs electromagnetic radiation absorber 906, and a second InGaAs electromagnetic radiation absorber 910 is stacked on the second buffer 908 (i.e., with the second buffer 908 disposed between the first InGaAs electromagnetic radiation absorber 906 and the second InGaAs electromagnetic radiation absorber 910).

The first and second InGaAs electromagnetic radiation absorbers 906, 910 may be electrically disposed between a first electrical contact 912 and a second electrical contact 914, with the first and second electrical contacts 912, 914 being used to electrically bias the first InGaAs electromagnetic radiation absorber 906 in a forward direction and sense a current corresponding to a total current generated by the first InGaAs electromagnetic radiation absorber 906. Alternatively, the first and second electrical contacts 912, 914 may be used to electrically bias the second InGaAs electromagnetic radiation absorber 910 in a reverse direction and sense a current corresponding to a total current generated by the second InGaAs electromagnetic radiation absorber 910. In other embodiments, and depending on the implantation or doping of the first and second InGaAs electromagnetic radiation absorbers 906, 910, the electrical contacts 912, 914 may be used to bias and read the first and second InGaAs electromagnetic radiation absorbers 906, 910 in opposite directions. In some embodiments, the first electrical contact 912 may be deposited on the first buffer 904, and the second electrical contact 914 may be deposited on the second InGaAs electromagnetic radiation absorber 910.

As shown in FIG. 9A, the first buffer 904 may extend over the entirety of the InP substrate 902, or over a greater portion of the InP substrate 902 than each of the first and second InGaAs electromagnetic radiation absorbers 906, 910 and second buffer 908. The first electrical contact 912 is shown to extend along three sides of the first InGaAs electromagnetic radiation absorber 906, but in other embodiments may be positioned adjacent only one side of the first InGaAs electromagnetic radiation absorber 906, or may surround the first InGaAs electromagnetic radiation absorber 906, or have other configurations. Although the perimeters of all substrate, buffer, and absorber components are shown to be rectangular or square in FIG. 9A, the perimeters of these elements could alternatively have any shape.

Figure 10:
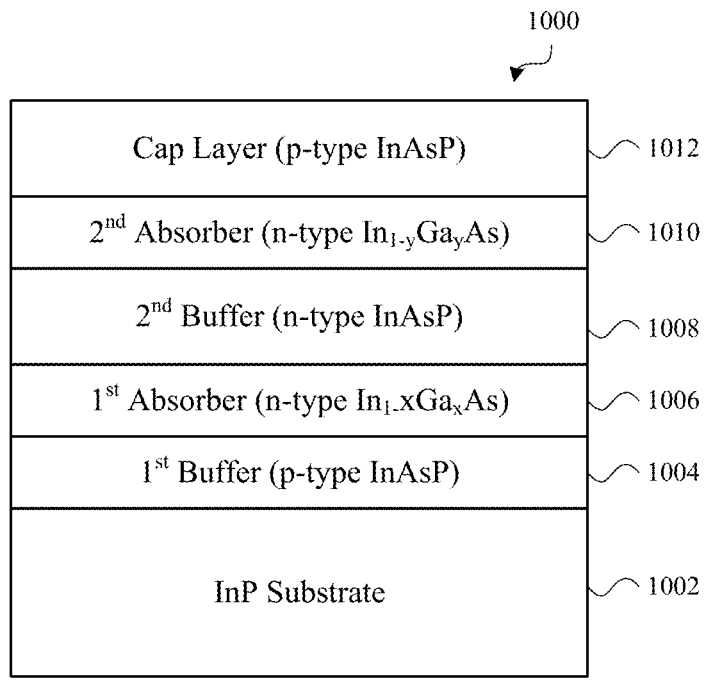

FIG. 10 shows an elevation of an InGaAs detector 1000 in which first and second InGaAs electromagnetic radiation absorbers 1006, 1010 are configured as back-to-back photodiodes. The InGaAs detector 1000 includes an InP substrate 1002 on which a first set of one or more buffer layers (collectively referred to as a first buffer 1004) is stacked. A first InGaAs electromagnetic radiation absorber 1006 is stacked on the first buffer 1004 (i.e., with the first buffer 1004 disposed between the InP substrate 1002 and the first InGaAs electromagnetic radiation absorber 1006). A second set of one or more buffer layers (collectively referred to as a second buffer 1008) is stacked on the first InGaAs electromagnetic radiation absorber 1006, and a second InGaAs electromagnetic radiation absorber 1010 is stacked on the second buffer 1008 (i.e., with the second buffer 1008 disposed between the first InGaAs electromagnetic radiation absorber 1006 and the second InGaAs electromagnetic radiation absorber 1010). A cap layer 1012 is stacked on the second InGaAs electromagnetic radiation absorber 1010 (i.e., with the second InGaAs electromagnetic radiation absorber 1010 disposed between the second buffer 1008 and the cap layer 1012.

Each of the first and second InGaAs electromagnetic radiation absorbers 1006, 1010 may be n-doped (or n-type) InGaAs electromagnetic radiation absorbers. Each of the first and second buffers 1004, 1008 may include one or more layers of indium arsenide phosphide (InAsP), with the first buffer 1004 including one or more p-doped (or p-type) InAsP layers, and with the second buffer 1008 including one or more n-doped (or n-type) InAsP layers. The InGaAs electromagnetic radiation absorbers 1006, 1010, buffers 1004, 1008, and cap layer 1012 therefore form a pnnp layer structure including back-to-back photodiodes. A forward bias (or alternatively, a reverse bias) applied to the pnnp layer structure enables a readout of the first InGaAs electromagnetic radiation absorber 1006 (or the second InGaAs electromagnetic radiation absorber 1010).

In alternative embodiments, the InGaAs electromagnetic radiation absorbers 1006, 1010, buffers 1004, 1008, and cap layer 1012 may be implanted or doped to form a nppn, nBn, or pBp layer structure including back-to-back photodiodes.

Figure 11:
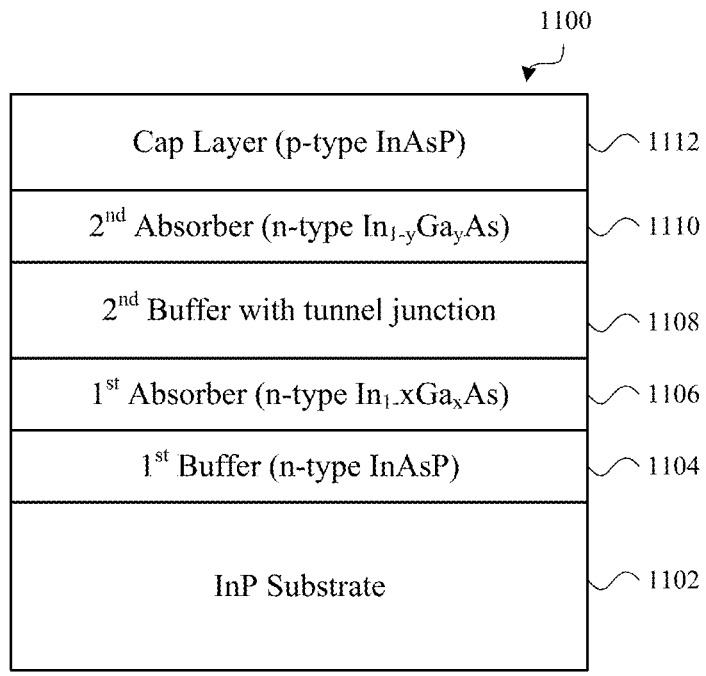

FIG. 11 shows an elevation of an InGaAs detector 1100 in which first and second InGaAs electromagnetic radiation absorbers 1106, 1110 are configured as two photodetectors facing the same direction and connected by a tunnel junction. The InGaAs detector 1100 includes an InP substrate 1102 on which a first set of one or more buffer layers (collectively referred to as a first buffer 1104) is stacked. A first InGaAs electromagnetic radiation absorber 1106 is stacked on the first buffer 1104 (i.e., with the first buffer 1104 disposed between the InP substrate 1102 and the first InGaAs electromagnetic radiation absorber 1106). A second set of one or more buffer layers (collectively referred to as a second buffer 1108) is stacked on the first InGaAs electromagnetic radiation absorber 1106, and a second InGaAs electromagnetic radiation absorber 1110 is stacked on the second buffer 1108 (i.e., with the second buffer 1108 disposed between the first InGaAs electromagnetic radiation absorber 1106 and the second InGaAs electromagnetic radiation absorber 1110). A cap layer 1112 is stacked on the second InGaAs electromagnetic radiation absorber 1110 (i.e., with the second InGaAs electromagnetic radiation absorber 1110 disposed between the second buffer 1108 and the cap layer 1112).

Each of the first and second InGaAs electromagnetic radiation absorbers 1106, 1110 may be n-doped (or n-type) InGaAs electromagnetic radiation absorbers. Each of the first and second buffers 1104, 1108 may include one or more layers of indium arsenide phosphide (InAsP), with the first buffer 1104 including one or more n-doped (or n-type) InAsP layers, and with the second buffer 1108 including one or more n-doped (or n-type) InAsP layers and one or more p-doped (or p-type) InAsP layers. The InGaAs electromagnetic radiation absorbers 1106, 1110, buffers 1104, 1108, and cap layer 1112 therefore form a pnpn layer structure including stacked photodiodes with a tunnel junction. The tunnel junction allows photocurrent to be read out from both InGaAs electromagnetic radiation absorbers 1106, 1110 with the same bias polarity, unlike the InGaAs detector described with reference to FIG. 10, which requires different bias voltages to extract photocurrents from different InGaAs electromagnetic radiation absorbers.

Figure 12A:
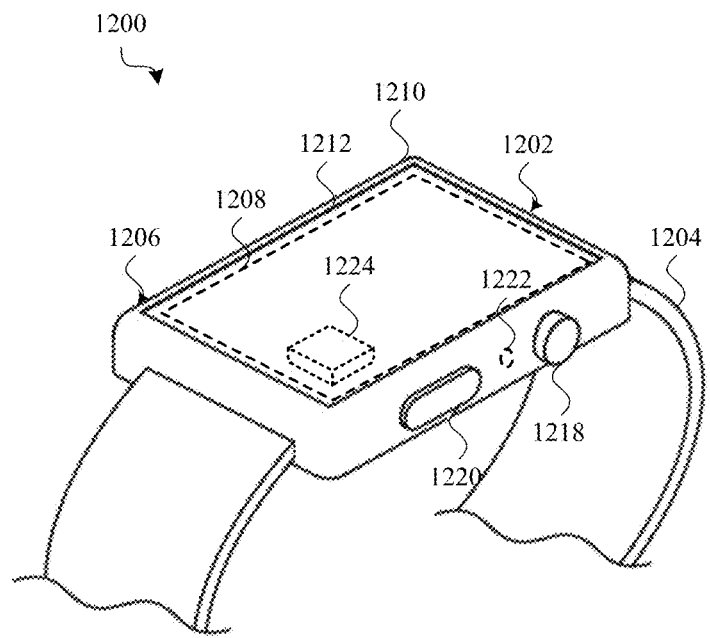
FIGS. 12A and 12B show an example of a device that includes a set of sensors.
Figure 12B:
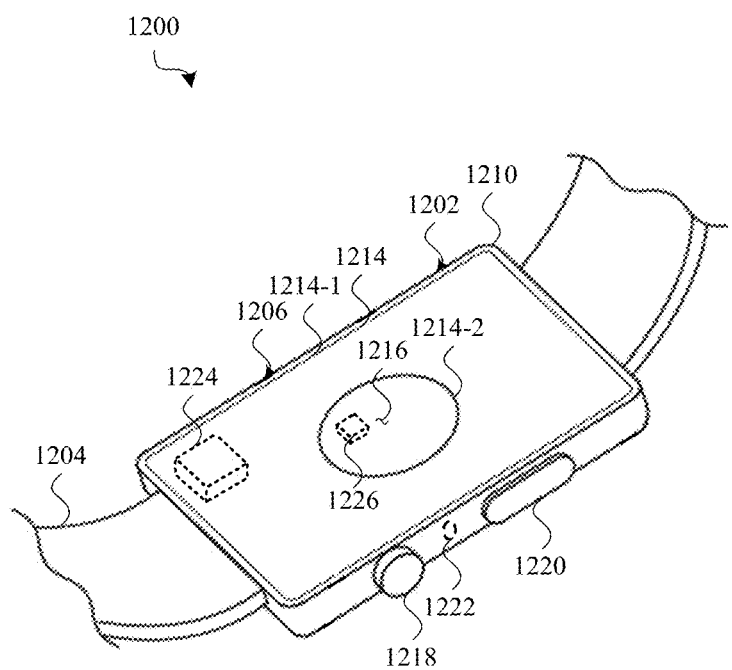

FIGS. 12A and 12B show an example of a device 1200 (an electronic device) that includes a set of sensors. The sensors may be used, for example, to acquire biological information from the wearer or user of the device 1200 (e.g., a heart rate, respiration rate, blood pressure, blood flow rate, blood oxygenation, blood glucose level, and so on), or to determine a status of the device 1200 (e.g., whether the device 1200 is being worn or a tightness of the device 1200). The device's dimensions and form factor, and inclusion of a band 1204 (e.g., a wrist band), suggest that the device 1200 is an electronic watch, fitness monitor, or health diagnostic device. However, the device 1200 could alternatively be any type of wearable device. FIG. 12A shows a front isometric view of the device 1200, and FIG. 12B shows a back isometric view of the device 1200.

The device 1200 may include a body 1202 (e.g., a watch body) and a band 1204. The body 1202 may include an input or selection device, such as a crown 1218 or a button 1220. The band 1204 may be attached to a housing 1206 of the body 1202, and may be used to attach the body 1202 to a body part (e.g., an arm, wrist, leg, ankle, or waist) of a user. The body 1202 may include a housing 1206 that at least partially surrounds a display 1208. In some embodiments, the housing 1206 may include a sidewall 1210, which sidewall 1210 may support a front cover 1212 (FIG. 12A) and/or a back cover 1214 (FIG. 12B). The front cover 1212 may be positioned over the display 1208, and may provide a window through which the display 1208 may be viewed. In some embodiments, the display 1208 may be attached to (or abut) the sidewall 1210 and/or the front cover 1212. In alternative embodiments of the device 1200, the display 1208 may not be included and/or the housing 1206 may have an alternative configuration.

The display 1208 may include one or more light-emitting elements including, for example, light-emitting elements that define a light-emitting diode (LED) display, organic LED (OLED) display, liquid crystal display (LCD), electroluminescent (EL) display, or other type of display. In some embodiments, the display 1208 may include, or be associated with, one or more touch and/or force sensors that are configured to detect a touch and/or a force applied to a surface of the front cover 1212.

In some embodiments, the sidewall 1210 of the housing 1206 may be formed using one or more metals (e.g., aluminum or stainless steel), polymers (e.g., plastics), ceramics, or composites (e.g., carbon fiber). The front cover 1212 may be formed, for example, using one or more of glass, a crystal (e.g., sapphire), or a transparent polymer (e.g., plastic) that enables a user to view the display 1208 through the front cover 1212. In some cases, a portion of the front cover 1212 (e.g., a perimeter portion of the front cover 1212) may be coated with an opaque ink to obscure components included within the housing 1206. In some cases, all of the exterior components of the housing 1206 may be formed from a transparent material, and components within the device 1200 may or may not be obscured by an opaque ink or opaque structure within the housing 1206.

The back cover 1214 may be formed using the same material(s) that are used to form the sidewall 1210 or the front cover 1212. In some cases, the back cover 1214 may be part of a monolithic element that also forms the sidewall 1210. In other cases, and as shown, the back cover 1214 may be a multi-part back cover, such as a back cover having a first back cover portion 1214-1 attached to the sidewall 1210 and a second back cover portion 1214-2 attached to the first back cover portion 1214-1. The second back cover portion 1214-2 may in some cases have a circular perimeter and an arcuate exterior surface 1216 (i.e., an exterior surface 1216 having an arcuate profile).

The front cover 1212, back cover 1214, or first back cover portion 1214-1 may be mounted to the sidewall 1210 using fasteners, adhesives, seals, gaskets, or other components. The second back cover portion 1214-2, when present, may be mounted to the first back cover portion 1214-1 using fasteners, adhesives, seals, gaskets, or other components.

A display stack or device stack (hereafter referred to as a "stack") including the display 1208 may be attached (or abutted) to an interior surface of the front cover 1212 and extend into an interior volume of the device 1200. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 1212 (e.g., to a display surface of the device 1200).

In some cases, a force sensor (or part of a force sensor system) may be positioned within the interior volume below and/or to the side of the display 1208 (and in some cases within the device stack). The force sensor (or force sensor system) may be triggered in response to the touch sensor detecting one or more touches on the front cover 1212 (or a location or locations of one or more touches on the front cover 1212), and may determine an amount of force associated with each touch, or an amount of force associated with the collection of touches as a whole. The force sensor (or force sensor system) may alternatively trigger operation of the touch sensor (or touch sensor system), or may be used independently of the touch sensor (or touch sensor system).

The device 1200 may include various sensors. In some embodiments, the device 1200 may have a port 1222 (or set of ports) on a side of the housing 1206 (or elsewhere), and an ambient pressure sensor, ambient temperature sensor, internal/external differential pressure sensor, gas sensor, particulate matter concentration sensor, or air quality sensor may be positioned in or near the port(s) 1222.

In some cases, one or more skin-facing sensors 1226 may be included within the device 1200. The skin-facing sensor(s) may emit or transmit signals through the housing 1206 (or back cover 1214) and/or receive signals or sense conditions through the housing 1206 (or back cover 1214). For example, in some embodiments, one or more such sensors may include a number of electromagnetic radiation emitters (e.g., visible light and/or IR emitters) and/or a number of electromagnetic radiation detectors (e.g., visible light and/or IR detectors, such as any of the InGaAs detectors described herein). The sensors may be used, for example, to acquire biological information from the wearer or user of the device 1200 (e.g., a heart rate, respiration rate, blood pressure, blood flow rate, blood oxygenation, blood glucose level, and so on), or to determine a status of the device 1200 (e.g., whether the device 1200 is being worn or a tightness of the device 1200).

The device 1200 may include circuitry 1224 (e.g., a processor and/or other components) configured to determine or extract, at least partly in response to signals received directly or indirectly from one or more of the device's sensors, biological parameters of the device's user and/or a status of the device 1200, for example. In some embodiments, the circuitry 1224 may be configured to convey the determined or extracted parameters or statuses via an output device of the device 1200. For example, the circuitry 1224 may cause the indication(s) to be displayed on the display 1208, indicated via audio or haptic outputs, transmitted via a wireless communications interface or other communications interface, and so on. The circuitry 1224 may also or alternatively maintain or alter one or more settings, functions, or aspects of the device 1200, including, in some cases, what is displayed on the display 1208.

Figure 13A:
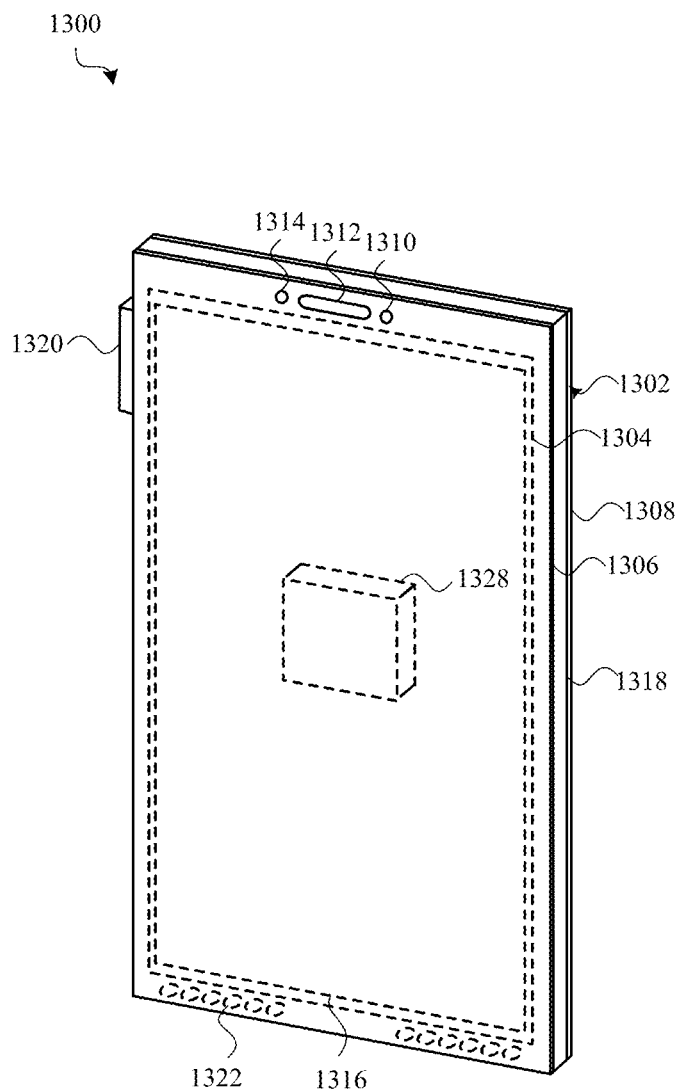
FIGS. 13A and 13B shows another example of a device that includes a set of sensors.
Figure 13B:
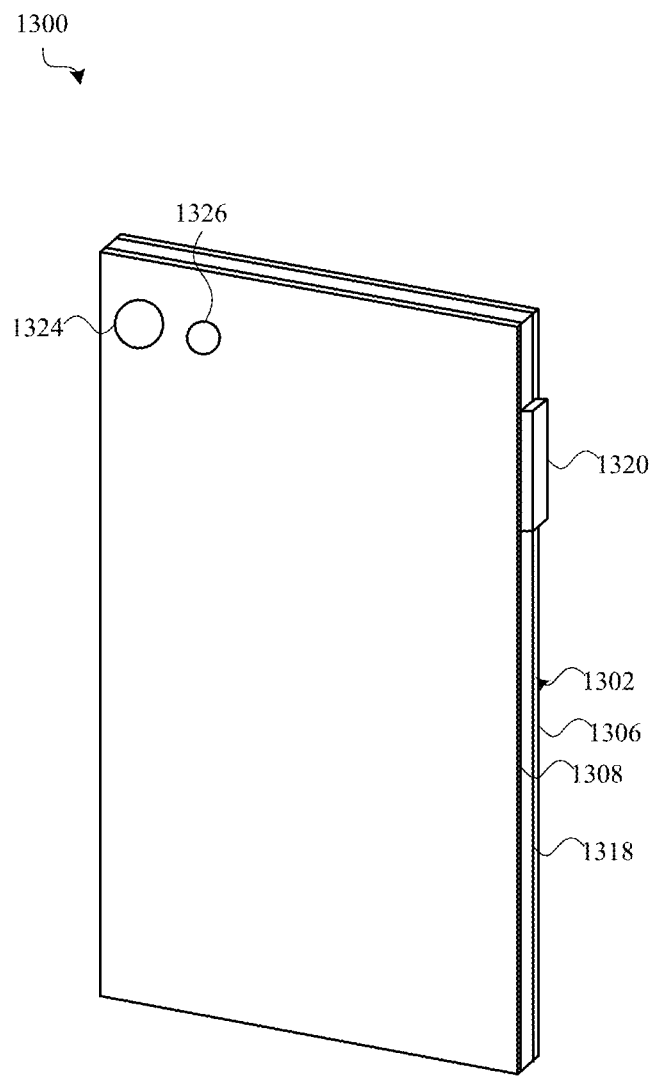

FIGS. 13A and 13B show another example of a device 1300 (an electronic device) that includes a set of sensors. The sensors may be used, for example, to acquire biological information from the user of the device 1300, to determine parameters of an environment of the device 1300 (e.g., air quality), or to determine a distance to or composition of a target or object. The device's dimensions and form factor, including the ratio of the length of its long sides to the length of its short sides, suggest that the device 1300 is a mobile phone (e.g., a smartphone). However, the device's dimensions and form factor are arbitrarily chosen, and the device 1300 could alternatively be any portable electronic device including, for example a mobile phone, tablet computer, portable computer, portable music player, portable terminal, vehicle navigation system, robot navigation system, or other portable or mobile device. The device 1300 could also be a device that is semi-permanently located (or installed) at a single location (e.g., a door lock, thermostat, refrigerator, or other appliance). FIG. 13A shows a front isometric view of the device 1300, and FIG. 13B shows a rear isometric view of the device 1300. The device 1300 may include a housing 1302 that at least partially surrounds a display 1304. The housing 1302 may include or support a front cover 1306 or a rear cover 1308. The front cover 1306 may be positioned over the display 1304, and may provide a window through which the display 1304 (including images displayed thereon) may be viewed by a user. In some embodiments, the display 1304 may be attached to (or abut) the housing 1302 and/or the front cover 1306.

The display 1304 may include one or more light-emitting elements or pixels, and in some cases may be an LED display, an OLED display, an LCD, an EL display, a laser projector, or another type of electronic display. In some embodiments, the display 1304 may include, or be associated with, one or more touch and/or force sensors that are configured to detect a touch and/or a force applied to a surface of the front cover 1306.

The various components of the housing 1302 may be formed from the same or different materials. For example, a sidewall 1318 of the housing 1302 may be formed using one or more metals (e.g., stainless steel), polymers (e.g., plastics), ceramics, or composites (e.g., carbon fiber). In some cases, the sidewall 1318 may be a multi-segment sidewall including a set of antennas. The antennas may form structural components of the sidewall 1318. The antennas may be structurally coupled (to one another or to other components) and electrically isolated (from each other or from other components) by one or more non-conductive segments of the sidewall 1318. The front cover 1306 may be formed, for example, using one or more of glass, a crystal (e.g., sapphire), or a transparent polymer (e.g., plastic) that enables a user to view the display 1304 through the front cover 1306. In some cases, a portion of the front cover 1306 (e.g., a perimeter portion of the front cover 1306) may be coated with an opaque ink to obscure components included within the housing 1302. The rear cover 1308 may be formed using the same material(s) that are used to form the sidewall 1318 or the front cover 1306, or may be formed using a different material or materials. In some cases, the rear cover 1308 may be part of a monolithic element that also forms the sidewall 1318 (or in cases where the sidewall 1318 is a multi-segment sidewall, those portions of the sidewall 1318 that are non-conductive). In still other embodiments, all of the exterior components of the housing 1302 may be formed from a transparent material, and components within the device 1300 may or may not be obscured by an opaque ink or opaque structure within the housing 1302.

The front cover 1306 may be mounted to the sidewall 1318 to cover an opening defined by the sidewall 1318 (i.e., an opening into an interior volume in which various electronic components of the device 1300, including the display 1304, may be positioned). The front cover 1306 may be mounted to the sidewall 1318 using fasteners, adhesives, seals, gaskets, or other components.

A display stack or device stack (hereafter referred to as a "stack") including the display 1304 (and in some cases the front cover 1306) may be attached (or abutted) to an interior surface of the front cover 1306 and extend into the interior volume of the device 1300. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 1306 (e.g., to a display surface of the device 1300).

The stack may also include one or an array of sensors 1316, with the sensors positioned in front of or behind, or interspersed with, the light-emitting elements of the display 1304. In some cases, an array of sensors 1316 may extend across an area equal in size to the area of the display 1304. Alternatively, the array of photodetectors 1316 may extend across an area that is smaller than or greater than the area of the display 1304, or may be positioned entirely adjacent the display 1304. Although the array of sensors 1316 is shown to have a rectangular boundary, the array could alternatively have a boundary with a different shape, including, for example, an irregular shape. The array of sensors 1316 may be variously configured as an ambient light sensor, a light-emitting element (e.g., OLED) health sensor (e.g., age sensor), a touch sensor, a proximity sensor, a health sensor, a biometric sensor (e.g., a fingerprint sensor or facial recognition sensor), a camera, a depth sensor, and so on. The array of sensors 1316 may also or alternatively function as a proximity sensor, for determining whether an object (e.g., a finger, face, or stylus) is proximate to the front cover 1306. In some embodiments, the array of sensors 1316 may provide the touch sensing capability (i.e., touch sensor) of the stack.

In some cases, a force sensor (or part of a force sensor system) may be positioned within the interior volume below and/or to the side of the display 1304 (and in some cases within the stack). The force sensor (or force sensor system) may be triggered in response to the touch sensor detecting one or more touches on the front cover 1306 (or indicating a location or locations of one or more touches on the front cover 1306), and may determine an amount of force associated with each touch, or an amount of force associated with the collection of touches as a whole.

As shown primarily in FIG. 13A, the device 1300 may include various other components. For example, the front of the device 1300 may include one or more front-facing cameras 1310 (including one or more image sensors), speakers 1312, microphones, or other components 1314 (e.g., audio, imaging, and/or sensing components) that are configured to transmit or receive signals to/from the device

1300. In some cases, a front-facing camera 1310, alone or in combination with other sensors, may be configured to operate as a bio-authentication or facial recognition sensor. Additionally or alternatively, the array of sensors 1316 may be configured to operate as a front-facing camera 1310, a bio-authentication sensor, or a facial recognition sensor.

The device 1300 may also include buttons or other input devices positioned along the sidewall 1318 and/or on a rear surface of the device 1300. For example, a volume button or multipurpose button 1320 may be positioned along the sidewall 1318, and in some cases may extend through an aperture in the sidewall 1318. The sidewall 1318 may include one or more ports 1322 that allow air, but not liquids, to flow into and out of the device 1300. In some embodiments, one or more sensors may be positioned in or near the port(s) 1322. For example, an ambient pressure sensor, ambient temperature sensor, internal/external differential pressure sensor, gas sensor, particulate matter concentration sensor, or air quality sensor may be positioned in or near a port 1322.

In some embodiments, the rear surface of the device 1300 may include a rear-facing camera 1324. A flash or light source 1326 may also be positioned along the rear of the device 1300 (e.g., near the rear-facing camera). In some cases, the rear surface of the device 1300 may include multiple rear-facing cameras.

In some cases, the sensor(s) 1316, the front-facing camera 1310, the rear-facing camera 1324, and/or other sensors positioned on the front, back, or sides of the device 1300 may emit or transmit signals through the housing 1302 (including the front cover 1306, back cover 1308, or sidewall 1318) and/or receive signals or sense conditions through the housing 1302. For example, in some embodiments, one or more such sensors may include a number of electromagnetic radiation emitters (e.g., visible light and/or IR emitters) and/or a number of electromagnetic radiation detectors (e.g., visible light and/or IR detectors, such as any of the InGaAs detectors described herein).

The device 1300 may include circuitry 1328 (e.g., a processor and/or other components) configured to determine or extract, at least partly in response to signals received directly or indirectly from one or more of the device's sensors, biological parameters of the device's user, a status of the device 1300, parameters of an environment of the device 1300 (e.g., air quality), or a composition of a target or object, for example. In some embodiments, the circuitry 1328 may be configured to convey the determined or extracted parameters or statuses via an output device of the device 1300. For example, the circuitry 1328 may cause the indication(s) to be displayed on the display 1304, indicated via audio or haptic outputs, transmitted via a wireless communications interface or other communications interface, and so on. The circuitry 1328 may also or alternatively maintain or alter one or more settings, functions, or aspects of the device 1300, including, in some cases, what is displayed on the display 1304.

Figure 14:
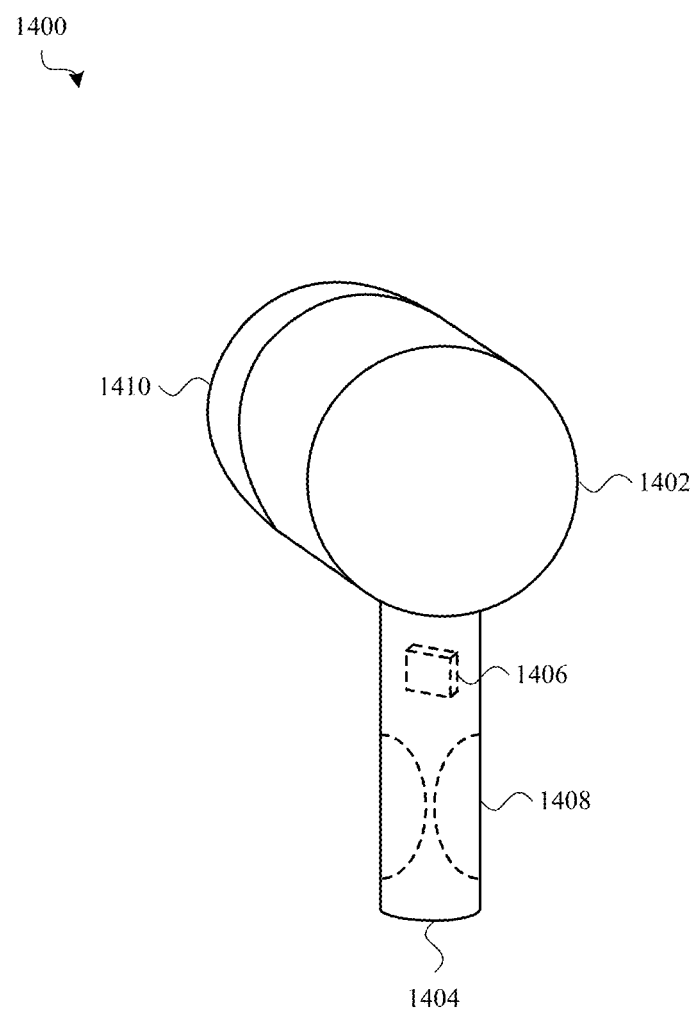
FIG. 14 shows an example of an earbud that includes a set of sensors.

FIG. 14 shows an example of an earbud 1400 (an electronic device) that includes a set of sensors 1408. The earbud 1400 may include a housing 1402. The housing 1402 may hold a speaker 1410 that can be inserted into a user's ear, an optional microphone 1404, and circuitry 1406 that can be used to acquire audio from the microphone 1404, transmit audio to the speaker 1402, and communicate audio between the speaker 1402, the microphone 1404, and one or more remote devices. The circuitry 1406 may communicate with a remote device wirelessly (e.g., via a wireless communications interface, using a Wi-Fi, BLUETOOTH®, or cellular radio communications protocol, for example) or via one or more wires (e.g., via a wired communications interface, such as a Universal Serial Bus (USB) communications interface). In addition to communicating audio, the circuitry 1406 may transmit or receive instructions and so on.

The sensors 1408 may be used, for example, to determine a proximity of a user to the earbud 1400 or speaker 1410, or to receive input from a user. In some cases, a sensor may be used to identify a gesture of a user (e.g., a swipe gesture or a press gesture) made on a surface of the earbud 1400 or in free space in proximity to the earbud 1400. The sensors 1408 may include skin-facing and/or non-skin-facing sensors. In some embodiments, one or more such sensors may include a number of electromagnetic radiation emitters (e.g., visible light and/or IR emitters) and/or a number of electromagnetic radiation detectors (e.g., visible light and/or IR detectors, such as any of the InGaAs detectors described herein).

The circuitry 1406 may include a processor and/or other components that are configured to determine or extract, at least partly in response to signals received directly or indirectly from one or more of the sensors 1408, information related to a proximity of a user, an input of a user, and so on. In some embodiments, the circuitry 1406 may be configured to convey the determined or extracted parameters or statuses via an output device of the earbud 1400. For example, the circuitry 1406 may cause the indication(s) to be output via the speaker 1410 or a haptic device, transmitted via a wireless communications interface or other communications interface, and so on. The circuitry 1406 may also or alternatively maintain or alter one or more settings, functions, or aspects of the earbud 1400, including, in some cases, what is output via the speaker 1410.

Figure 15:
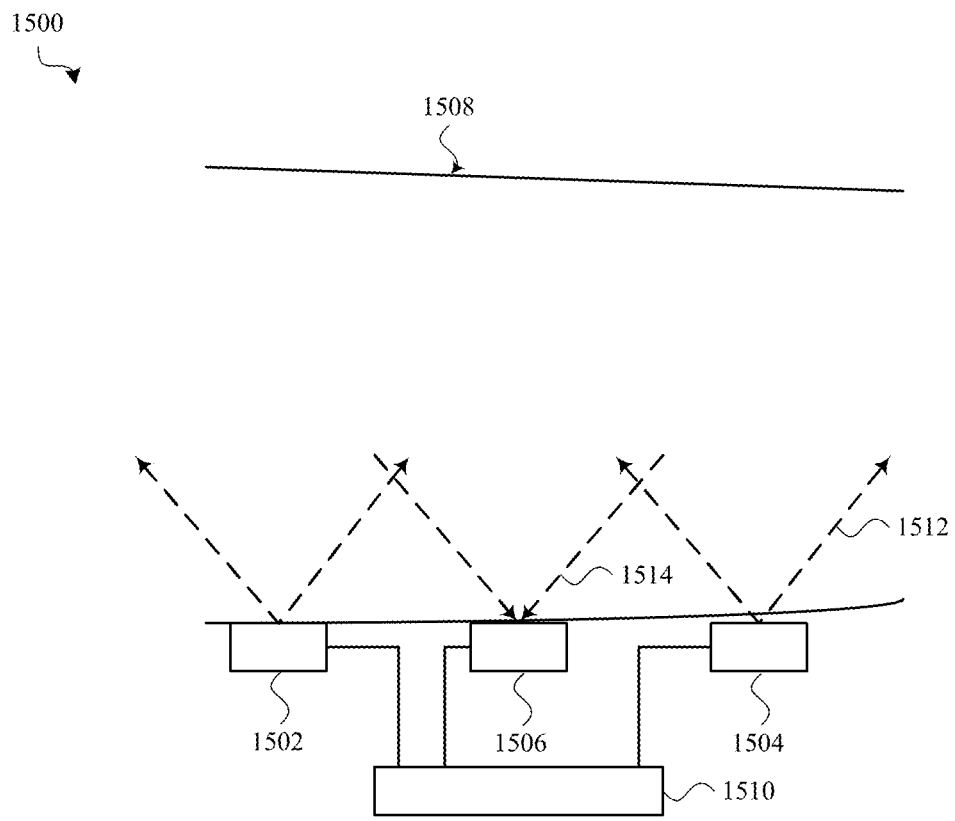
FIG. 15 shows an example elevation of a system of electromagnetic radiation emitters and detectors that may be included in an electronic device.

FIG. 15 shows an example elevation of a system 1500 of electromagnetic radiation emitters and detectors that may be included in an electronic device. In some cases, the system 1500 may be included in a wearable device, such as the wearable device described with reference to FIG. 12A-12B, 13A-13B, or 14.

By way of example, two electromagnetic radiation emitters 1502, 1504 and one electromagnetic radiation detector 1506 are shown in FIG. 15. When incorporated into the wearable device described with reference to FIGS. 12A and 12B, the emitters 1502, 1504 may be positioned and/or oriented to emit electromagnetic radiation 1512 toward a target (e.g., a wrist or other body part 1508 of the user of the wearable device). Similarly, the detector 1506 may be positioned and/or oriented to receive electromagnetic radiation 1514 returned (e.g., reflected or scattered) from the hair, skin, or internal structures of the wrist or other body part 1508.

The detector 1506 may be configured similarly to any of the detectors (e.g., InGaAs detectors) described herein, and may include two or more electromagnetic radiation absorbers.

The emitters 1502, 1504 may emit the same or different electromagnetic radiation wavelengths, and may have the same or different constructions (e.g., both may be lasers, one may be a laser and one may be an LED, and so on). In some embodiments, the emitters 1502, 1504 may be configured to emit different electromagnetic radiation wavelengths, and the detector 1506 may be configured to detect the different electromagnetic radiation wavelengths. If the detector's different electromagnetic radiation absorbers are configured to detect different and non-overlapping ranges of electromagnetic radiation wavelengths, the emitters 1502, 1504 may be activated to emit their different electromagnetic radiation wavelengths at the same time, and the detector 1506 may separately receive and quantify the electromagnetic radiation received from each of the emitters 1502, 1504. In this manner, the detector 1506 may be operated as a spectrometer with two or more resolvable spots.

A detection circuit 1510 may be configured to operate the emitters 1502, 1504 at the same or different times, and to read the current generated by the first and second electromagnetic radiation absorbers after simultaneous emissions from the emitters 1502, 1504, overlapping emissions from the emitters 1502, 1504, or disjoint (i.e., spaced in time) emissions from the emitters 1502, 1504.

Figure 16:
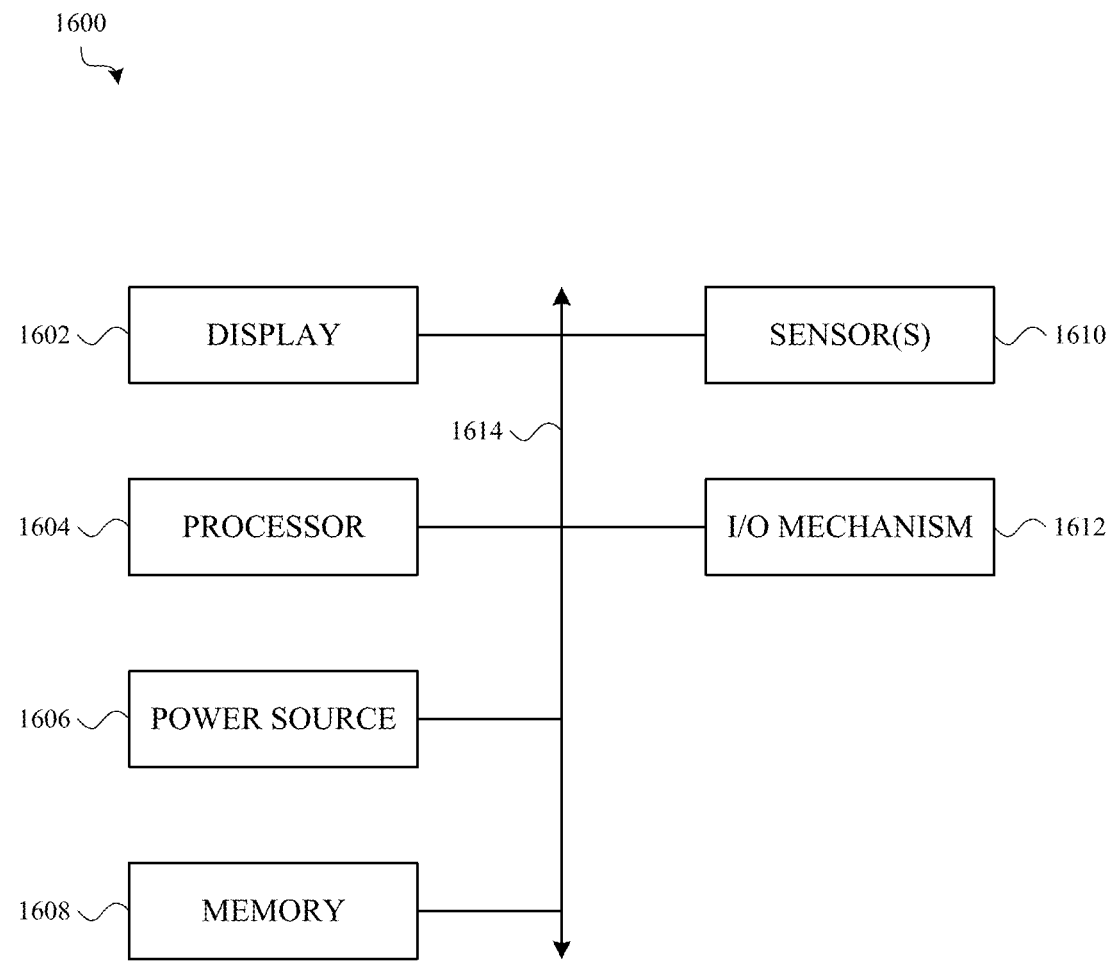
FIG. 16 shows a sample electrical block diagram of an electronic device.

FIG. 16 shows a sample electrical block diagram of an electronic device 1600, which electronic device may in some cases be implemented as the device described with reference to FIG. 12A-12B, 13A-13B, or 14. The electronic device 1600 may include an electronic display 1602 (e.g., a light-emitting display), a processor 1604, a power source 1606, a memory 1608 or storage device, a sensor system 1610, or an input/output (I/O) mechanism 1612 (e.g., an input/output device, input/output port, or haptic input/output interface). The processor 1604 may control some or all of the operations of the electronic device 1600. The processor 1604 may communicate, either directly or indirectly, with some or all of the other components of the electronic device 1600. For example, a system bus or other communication mechanism 1614 can provide communication between the electronic display 1602, the processor 1604, the power source 1606, the memory 1608, the sensor system 1610, and the I/O mechanism 1612.

The processor 1604 may be implemented as any electronic device capable of processing, receiving, or transmitting data or instructions, whether such data or instructions is in the form of software or firmware or otherwise encoded. For example, the processor 1604 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some cases, the processor 1604 may provide part or all of the circuitry described with reference to FIGS. 12A-15.

It should be noted that the components of the electronic device 1600 can be controlled by multiple processors. For example, select components of the electronic device 1600 (e.g., the sensor system 1610) may be controlled by a first processor and other components of the electronic device 1600 (e.g., the electronic display 1602) may be controlled by a second processor, where the first and second processors may or may not be in communication with each other.

The power source 1606 can be implemented with any device capable of providing energy to the electronic device 1600. For example, the power source 1606 may include one or more batteries or rechargeable batteries. Additionally or alternatively, the power source 1606 may include a power connector or power cord that connects the electronic device 1600 to another power source, such as a wall outlet.

The memory 1608 may store electronic data that can be used by the electronic device 1600. For example, the memory 1608 may store electrical data or content such as, for example, audio and video files, documents and applications, device settings and user preferences, timing signals, control signals, and data structures or databases. The memory 1608 may include any type of memory. By way of example only, the memory 1608 may include random access memory, read-only memory, Flash memory, removable memory, other types of storage elements, or combinations of such memory types.

The electronic device 1600 may also include a sensor system 1610, including sensors positioned almost anywhere on the electronic device 1600. In some cases, the sensor system 1610 may include one or more electromagnetic radiation emitters and detectors, positioned and/or configured as described with reference to any of FIGS. 2A-15. The sensor system 1610 may be configured to sense one or more type of parameters, such as but not limited to, vibration; light; touch; force; heat; movement; relative motion; biometric data (e.g., biological parameters) of a user; air quality; proximity; position; connectedness; matter type; and so on. By way of example, the sensor system 1610 may include one or more of (or multiple of) a heat sensor, a position sensor, a proximity sensor, a light or optical sensor (e.g., an electromagnetic radiation emitter and/or detector), an accelerometer, a pressure transducer, a gyroscope, a magnetometer, a health monitoring sensor, and an air quality sensor, and so on. Additionally, the sensor system 1610 may utilize any suitable sensing technology, including, but not limited to, interferometric, magnetic, pressure, capacitive, ultrasonic, resistive, optical, acoustic, piezoelectric, or thermal technologies.

The I/O mechanism 1612 may transmit or receive data from a user or another electronic device. The I/O mechanism 1612 may include the electronic display 1602, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1612 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources. The present disclosure contemplates that, in some instances, this gathered data may include personal information data (e.g., biological information) that uniquely identifies or can be used to identify, locate, contact, or diagnose a specific person. Such personal information data can include demographic data, location-based data, telephone numbers, email addresses, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to activate or deactivate various functions of the user's device, or gather performance metrics for the user's device or the user. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States (US), collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users may selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An electromagnetic radiation detector, comprising:
    an indium phosphide (InP) substrate having a first surface opposite a second surface;
    a first indium gallium arsenide (InGaAs) electromagnetic radiation absorber stacked on the first surface and configured to absorb a first set of electromagnetic radiation wavelengths;
    a set of one or more buffer layers stacked on the first InGaAs electromagnetic radiation absorber and configured to absorb at least some of the first set of electromagnetic radiation wavelengths;
    a second InGaAs electromagnetic radiation absorber stacked on the set of one or more buffer layers and configured to absorb a second set of electromagnetic radiation wavelengths; and
    an immersion condenser lens formed on the second surface and configured to direct electromagnetic radiation through the InP substrate and toward the first InGaAs electromagnetic radiation absorber and the second InGaAs electromagnetic radiation absorber; wherein,
    the second set of electromagnetic radiation wavelengths includes at least some electromagnetic radiation wavelengths that are not in the first set of electromagnetic radiation wavelengths; and
    a first responsivity of the first InGaAs electromagnetic radiation absorber and a second responsivity of the second InGaAs electromagnetic radiation absorber have a crossover point at an electromagnetic radiation wavelength within a water absorption band of about 1.85 μm to about 2.0 μm.

2. The electromagnetic radiation detector of claim 1, wherein:
    the set of one or more buffer layers is a first set of one or more buffer layers; and
    the electromagnetic radiation detector further comprises a second set of one or more buffer layers disposed directly on the InP substrate, between the InP substrate and the first InGaAs electromagnetic radiation absorber.

3. The electromagnetic radiation detector of claim 2, wherein the second set of one or more buffer layers comprises one or more indium arsenide phosphide (InAsP) layers.

4. The electromagnetic radiation detector of claim 1, wherein:
   at least the InP substrate, the first InGaAs electromagnetic radiation absorber, the set of one or more buffer layers, the second InGaAs electromagnetic radiation absorber, and the immersion condenser lens define at least a first detector unit; and
   the electromagnetic radiation detector comprises an array of detector units including the first detector unit, each detector unit in the array of detector units including a different portion of at least the InP substrate, the first InGaAs electromagnetic radiation absorber, the set of one or more buffer layers, and the second InGaAs electromagnetic radiation absorber.

5. The electromagnetic radiation detector of claim 1, wherein a first responsivity of the first InGaAs electromagnetic radiation absorber and a second responsivity of the second InGaAs electromagnetic radiation absorber have a crossover point at an electromagnetic radiation wavelength of about 1.9 micrometers.

6. The electromagnetic radiation detector of claim 1, wherein the first and second InGaAs electromagnetic radiation absorbers are configured as two photodetectors facing a same direction and are connected by a tunnel junction.

7. The electromagnetic radiation detector of claim 1, wherein the set of one or more buffer layers comprises one or more indium arsenide phosphide (InAsP) layers.

8. An electromagnetic radiation detection system, comprising:
   a substrate;
   on a first surface of the substrate,
      a first indium gallium arsenide (InGaAs) electromagnetic radiation absorber;
      a second InGaAs electromagnetic radiation absorber; and
      a buffer positioned between the first and second InGaAs electromagnetic radiation absorbers;
   a first electromagnetic radiation emitter;
   a second electromagnetic radiation emitter; and
   a detection circuit configured to operate the first and second electromagnetic radiation emitters, and to separately detect,
      first electromagnetic radiation emitted by the first electromagnetic radiation emitter by reading a first current generated by the first InGaAs electromagnetic radiation absorber; and
      second electromagnetic radiation emitted by the second electromagnetic radiation emitter by reading a second current generated by the second InGaAs electromagnetic radiation absorber; wherein,
   a first responsivity of the first InGaAs electromagnetic radiation absorber and a second responsivity of the second InGaAs electromagnetic radiation absorber have a crossover point at an electromagnetic radiation wavelength in a range of about 1.9 µm to about 2.0 µm.

9. The electromagnetic radiation detection system of claim 8, wherein the detection circuit is configured to operate the first and second electromagnetic radiation emitters at a same time, while separately detecting the first and second electromagnetic radiation emitted by the first and second electromagnetic radiation emitters.

10. The electromagnetic radiation detection system of claim 8, wherein the detection circuit is configured to operate the first and second electromagnetic radiation emitters at different times, while separately detecting the first and second electromagnetic radiation emitted by the first and second electromagnetic radiation emitters.

11. The electromagnetic radiation detection system of claim 8, wherein the buffer is a first buffer and the electromagnetic radiation detection system further comprises:
   on the first surface of the substrate,
      a second buffer positioned between the substrate and the first InGaAs electromagnetic radiation absorber.

12. The electromagnetic radiation detection system of claim 8, further comprising:
   on a second surface of the substrate, opposite the first surface,
      an immersion condenser lens configured to direct electromagnetic radiation through the substrate and toward the first and second InGaAs electromagnetic radiation absorbers.

13. The electromagnetic radiation detection system of claim 8, wherein a first absorption range of the first InGaAs electromagnetic radiation absorber and a second absorption range of the second InGaAs electromagnetic radiation absorber are non-overlapping.

14. The electromagnetic radiation detection system of claim 8, wherein the buffer comprises one or more indium arsenide phosphide (InAsP) layers.

15. An electronic device, comprising:
   a housing;
   an electromagnetic radiation emitter configured to emit electromagnetic radiation through the housing; and
   an electromagnetic radiation detector configured to receive electromagnetic radiation returned from a target; wherein,
   the electromagnetic radiation detector includes,
      a substrate having a first surface opposite a second surface;
      a first buffer stacked directly on the first surface;
      a first indium gallium arsenide (InGaAs) electromagnetic radiation absorber stacked on the first buffer and configured to absorb a first set of electromagnetic radiation wavelengths;
      a second buffer stacked on the first InGaAs electromagnetic radiation absorber and configured to absorb at least some of the first set of electromagnetic radiation wavelengths; and
      a second InGaAs electromagnetic radiation absorber stacked on the second buffer and configured to absorb a second set of electromagnetic radiation wavelengths; wherein,
   the second set of electromagnetic radiation wavelengths includes at least some electromagnetic radiation wavelengths that are not in the first set of electromagnetic radiation wavelengths; and
   a first responsivity of the first InGaAs electromagnetic radiation absorber and a second responsivity of the second InGaAs electromagnetic radiation absorber have a crossover point at an electromagnetic radiation wavelength within a water absorption band of about 1.85 µm to about 2.0 µm.

16. The electronic device of claim 15, wherein the substrate is an indium phosphide (InP) substrate.

17. The electronic device of claim 15, further comprising:
   a first electrical contact on the first buffer;
   a second electrical contact on the second InGaAs electromagnetic radiation absorber; and
   a third electrical contact on the second buffer.

18. The electronic device of claim 15, further comprising:
a first electrical contact on the first buffer; and
a second electrical contact on the second InGaAs electromagnetic radiation absorber; wherein,
the first and second electrical contacts are forward biased or reverse biased to read a current generated by the first InGaAs electromagnetic radiation absorber or the second InGaAs electromagnetic radiation absorber.

19. The electronic device of claim 15, further comprising:
a cap layer stacked on the second InGaAs electromagnetic radiation absorber; wherein,
the cap layer, the second InGaAs electromagnetic radiation absorber, the second buffer, and the first InGaAs electromagnetic radiation absorber are configured as a pnnp, nppn, or pnpn layer structure.

20. The electronic device of claim 15, wherein:
the housing has a back configured to face skin of a user when the electronic device is worn on a body part of the user; and
the electronic device further comprises a band configured to attach the housing to the body part.

21. The electronic device of claim 15, wherein each of the first buffer and the second buffer comprise one or more indium arsenide phosphide (InAsP) layers.

* * * * *